US011450706B2

(12) United States Patent
Saeki et al.

(10) Patent No.: US 11,450,706 B2
(45) Date of Patent: Sep. 20, 2022

(54) STRUCTURAL BODY, IMAGING DEVICE AND METHOD FOR MANUFACTURING THE STRUCTURAL BODY

(71) Applicant: Panasonic Intellectual Property Management Co., Ltd., Osaka (JP)

(72) Inventors: Kosaku Saeki, Toyama (JP); Seiji Nishiwaki, Hyogo (JP); Kenji Narumi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 297 days.

(21) Appl. No.: 16/847,704

(22) Filed: Apr. 14, 2020

(65) Prior Publication Data
US 2020/0243597 A1 Jul. 30, 2020

Related U.S. Application Data

(63) Continuation of application No. PCT/JP2018/037379, filed on Oct. 5, 2018.

(30) Foreign Application Priority Data

Oct. 31, 2017 (JP) .............................. JP2017-210429

(51) Int. Cl.
H01L 27/146 (2006.01)
G01J 3/10 (2006.01)
G01J 3/28 (2006.01)

(52) U.S. Cl.
CPC ........ H01L 27/14669 (2013.01); G01J 3/108 (2013.01); G01J 3/2823 (2013.01); H01L 27/14627 (2013.01)

(58) Field of Classification Search
CPC ......... H01L 27/14669; H01L 27/14627; H01L 27/14685; H01L 21/31; H01L 21/316;
(Continued)

(56) References Cited

U.S. PATENT DOCUMENTS

| 6,852,203 B1 | 2/2005 | Kawakami et al. |
| 2013/0032915 A1 | 2/2013 | Tonotani et al. |
| 2014/0146207 A1 | 5/2014 | Yokogawa |
| 2016/0360967 A1 | 12/2016 | Nishiwaki |
| 2017/0023410 A1 | 1/2017 | Nishiwaki |

FOREIGN PATENT DOCUMENTS

| CN | 114441481 A | * 2/2022 |
| JP | 10-335758 | 12/1998 |

(Continued)

OTHER PUBLICATIONS

International Search Report of PCT application No. PCT/JP2018/037379 dated Dec. 25, 2018.
(Continued)

Primary Examiner — Jarrett J Stark
(74) Attorney, Agent, or Firm — McDermott Will & Emery LLP

(57) ABSTRACT

A structural body includes a first dielectric layer and a second dielectric layer which is in contact with the first dielectric layer and which has a refractive index different from that of the first dielectric layer. The second dielectric layer includes at least two dielectric films different in hydrogen concentration from each other. The interface between the first dielectric layer and the second dielectric layer has periodic first irregularities.

19 Claims, 24 Drawing Sheets

(58) Field of Classification Search
CPC .............. H01L 21/318; H01L 27/1462; H01L 27/14625; G01J 3/108; G01J 3/2823; G02B 3/00; G02B 5/18
See application file for complete search history.

(56) References Cited

FOREIGN PATENT DOCUMENTS

| JP | 2003-255162 | | 9/2003 | |
|----|----|----|----|----|
| JP | 2009-157043 | | 7/2009 | |
| JP | 2011-022432 | | 2/2011 | |
| JP | 2011-187918 | | 9/2011 | |
| JP | 2013-030626 | | 2/2013 | |
| JP | 2013-038091 | | 2/2013 | |
| JP | 2014206680 | A * | 10/2014 | |
| JP | 2021152450 | A * | 9/2021 | |
| JP | 2021179310 | A * | 11/2021 | |
| WO | 2004/113974 | | 12/2004 | |
| WO | WO-2006009296 | A1 * | 1/2006 | .............. B32B 7/02 |
| WO | WO-2015016264 | A1 * | 2/2015 | ............. G02B 1/005 |
| WO | WO-2019073946 | A1 * | 4/2019 | ............. B32B 17/10 |
| WO | WO-2019087691 | A1 * | 5/2019 | ............. G01J 3/108 |
| WO | WO-2019102073 | A1 * | 5/2019 | |

OTHER PUBLICATIONS

W. A. Lanford et al., "The hydrogen content of plasma-deposited silicon nitride", Journal of Applied Physics vol. 49, No. 4, Apr. 1978, pp. 2473-2477.

* cited by examiner

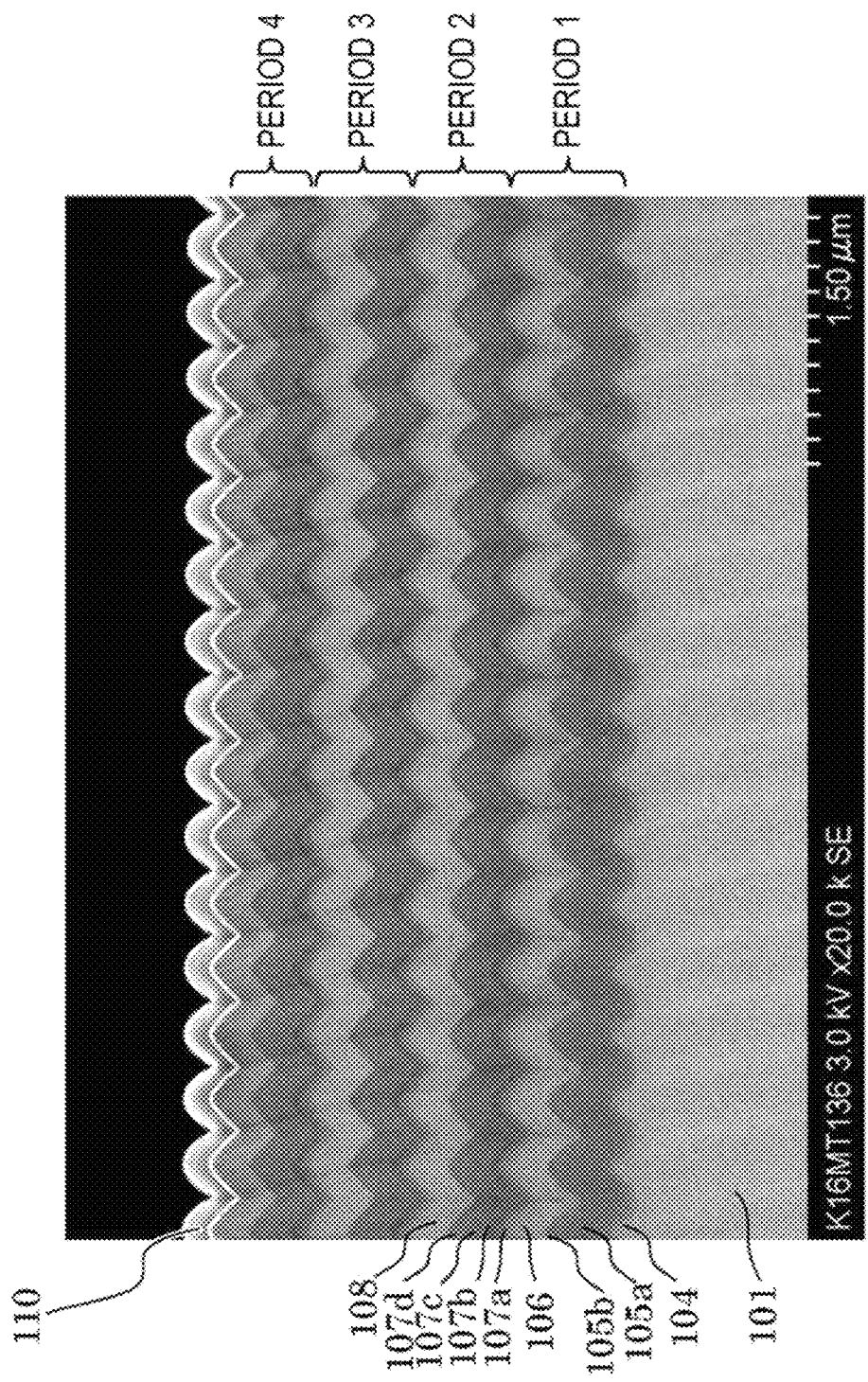

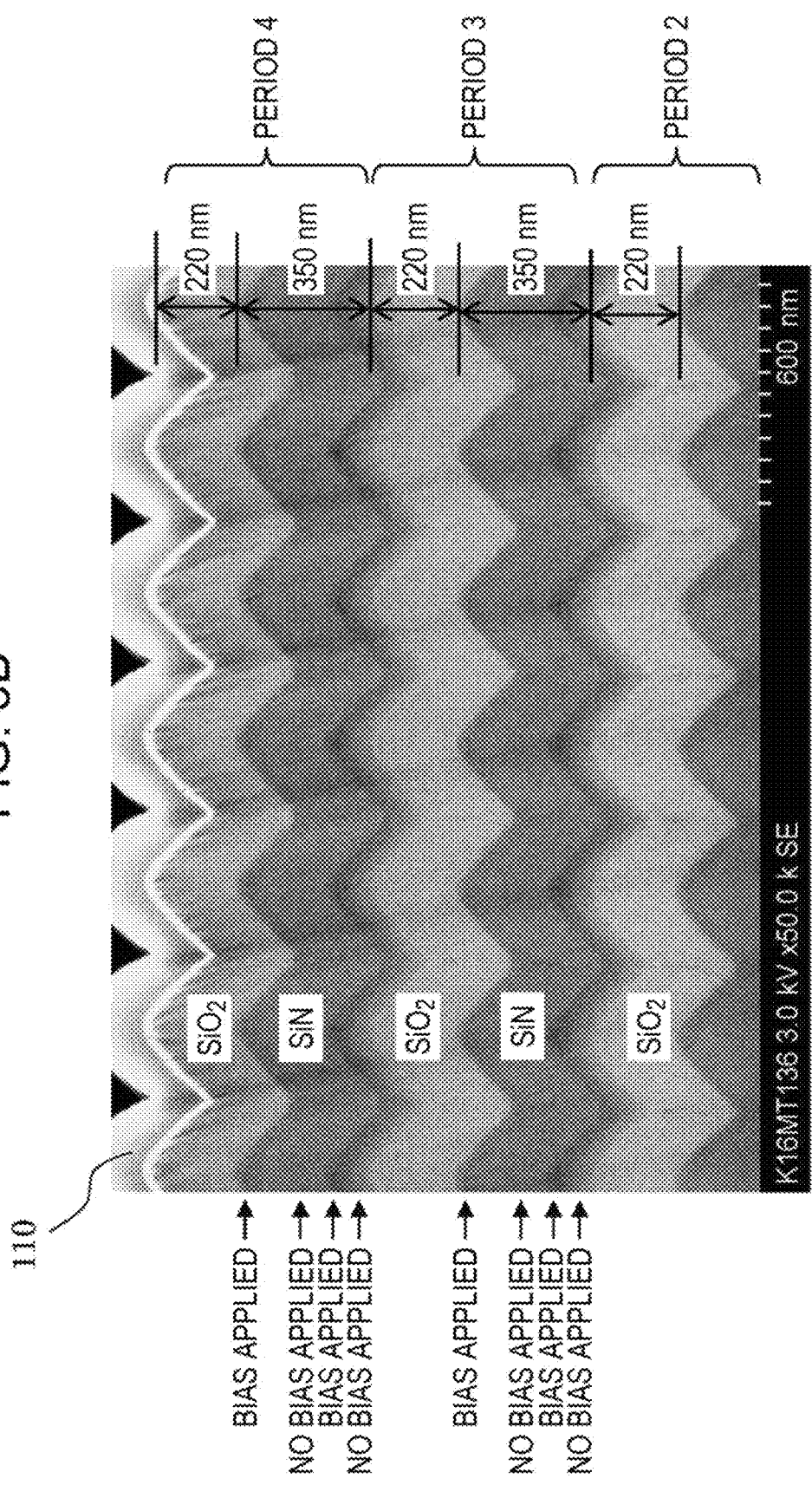

STRUCTURAL BODY, IMAGING DEVICE AND METHOD FOR MANUFACTURING THE STRUCTURAL BODY

BACKGROUND

1. Technical Field

The present disclosure relates to a structural body, an imaging device and a method for manufacturing the structural body.

2. Description of the Related Art

Hitherto, techniques for preparing a structural body having a periodic structure with a periodicity of about 1 μm or less in a substance have been developed. For example, Japanese Unexamined Patent Application Publication Nos. 10-335758 and 2003-255162 disclose a method for preparing a three-dimensional structural body by stacking a plurality of layers having periodic irregularities using sputter etching. The method disclosed in Japanese Unexamined Patent Application Publication Nos. 10-335758 and 2003-255162 is referred to as a self-cloning technique.

Japanese Unexamined Patent Application Publication No. 10-335758 disclose a method for forming a three-dimensionally periodic structure in such a manner that two or more types of materials are periodically deposited in sequence on a substrate having two-dimensionally periodic irregularities and at least one portion of the laminate is sputter-etched.

Japanese Unexamined Patent Application Publication No. 2003-255162 discloses detailed deposition conditions for alternately stacking high-refractive index films and low-refractive index films by a bias sputtering process. According to the disclosed deposition conditions, the deposition rate of the high-refractive index films is 16.8 nm/min and the deposition rate of the low-refractive index films is 3.1 nm/min. The thickness of each high-refractive index film is 190.5 nm. The thickness of each low-refractive index film is 272.5 nm. Thus, the sum of the thickness of the high-refractive index film and the thickness of low-refractive index film per cycle is 463.0 nm. An example of performing nine cycles of deposition under such conditions is disclosed. The film thickness of nine cycles is 4,167 nm and it takes 15.7 hours for deposition.

SUMMARY

In one general aspect, the techniques disclosed here feature a structural body including a first dielectric layer and a second dielectric layer which is in contact with the first dielectric layer and which has a refractive index different from a refractive index of the first dielectric layer. The second dielectric layer includes at least two dielectric films different in hydrogen concentration from each other. The interface between the first dielectric layer and the second dielectric layer has periodic first irregularities.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 3A is an image obtained by observing a cross section of an actually prepared structural body including four periods of two types of layers having different refractive indexes with a scanning electron microscope (SEM);

FIG. 3B is an enlarged view of a portion of the structural body that includes second to fourth periods;

DETAILED DESCRIPTION

Figure 1:
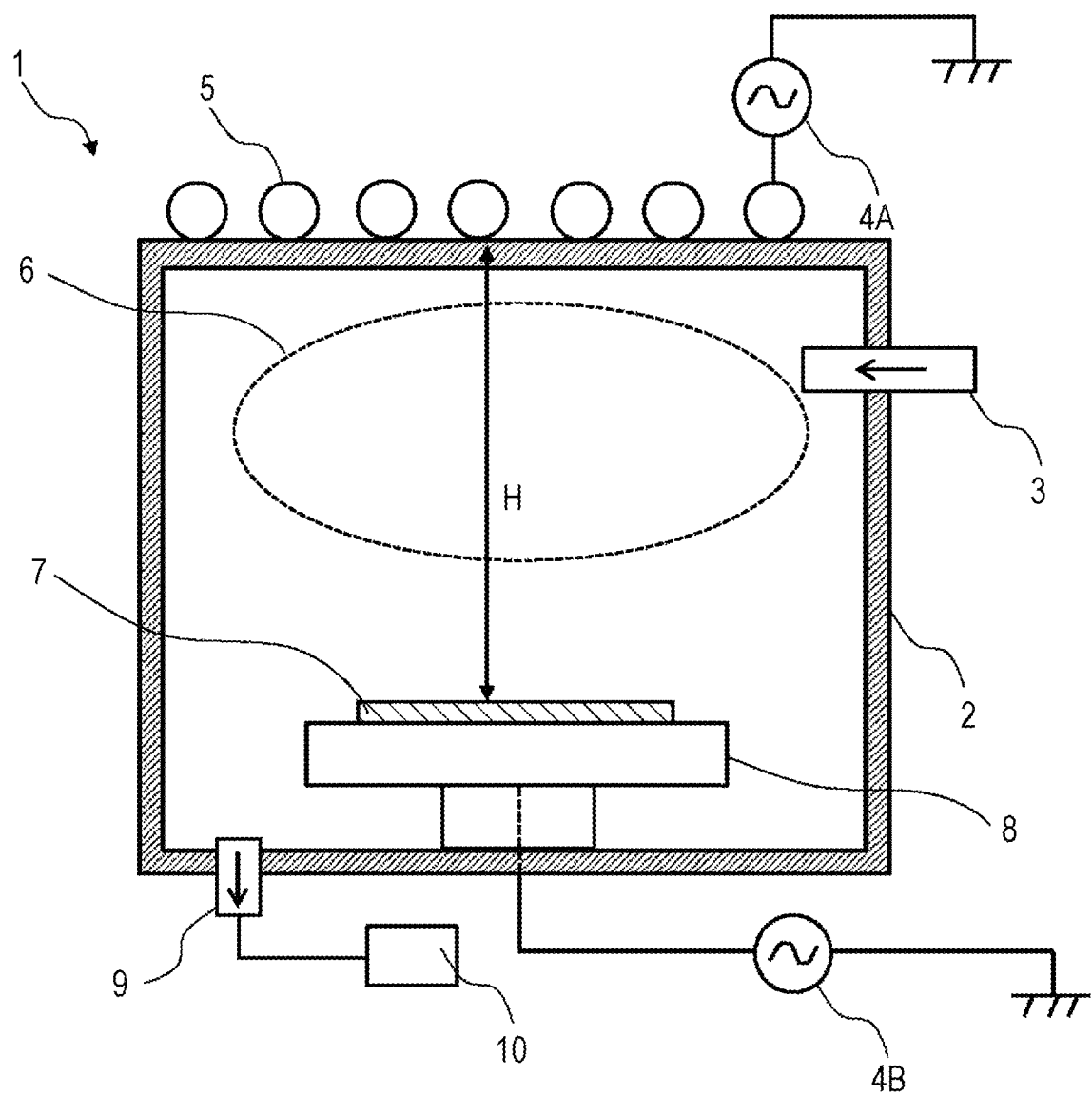
FIG. 1 is a schematic view showing the configuration of a high-density plasma CVD system used to manufacture a structural body according to a first embodiment of the present disclosure.

The present disclosure includes a structural body, an imaging device, and a method for manufacturing the structural body as described in items below.

Item 1

A structural body according to Item 1 of the present disclosure includes a first dielectric layer and a second dielectric layer which is in contact with the first dielectric layer and which has a refractive index different from a refractive index of the first dielectric layer.

The second dielectric layer includes at least two dielectric films different in hydrogen concentration from each other.

The interface between the first dielectric layer and the second dielectric layer has periodic first irregularities.

Item 2

In the structural body specified in Item 1, the at least two dielectric films may be different in thickness from each other.

Item 3

In the structural body specified in Item 1 or 2, the refractive index of the second dielectric layer may be higher than the refractive index of the first dielectric layer.

Item 4

In the structural body specified in any one of Items 1 to 3, the at least two dielectric films may be identical in refractive index to each other.

Item 5

In the structural body specified in any one of Items 1 to 4, each of the at least two dielectric films may be a silicon nitride film.

Item 6

In the structural body specified in Item 5, the at least two dielectric films may include a first silicon nitride film and a second silicon nitride film that is thinner than the first silicon nitride film and the second silicon nitride film may have a higher Si—H bond concentration or a higher hydrogen concentration as compared to the first silicon nitride film.

Item 7

In the structural body specified in Item 5, the silicon nitride film may have a refractive index of 1.90 to 2.20.

Item 8

In the structural body specified in any one of Items 1 to 7, the first dielectric layer may be a silicon oxide film.

Item 9

In the structural body specified in Item 8, the silicon oxide film may have a refractive index of 1.44 to 1.47.

Item 10

The structural body specified in Item 1 may further include a third dielectric layer and a fourth dielectric layer in contact with the third dielectric layer.

The second dielectric layer may be positioned on the fourth dielectric layer.

The interface between the third dielectric layer and the fourth dielectric layer may have periodic second irregularities.

The second irregularities may include a second concave portion with a flat bottom and a second convex portion adjacent to the second concave portion.

No slope may be present between the flat bottom of the second concave portion and the top of the second convex portion.

The interface between the fourth dielectric layer and the second dielectric layer may have periodic third irregularities.

The third irregularities may include a third concave portion with a partly flat bottom and a third convex portion adjacent to the third concave portion.

A slope may be present between the partly flat bottom of the third concave portion and the top of the third convex portion.

Item 11

In the structural body specified in Item 1, the first irregularities may include a first concave portion and a first convex portion adjacent to the first concave portion and a slope may be present between the bottom of the first concave portion and the top of the first convex portion.

Item 12

A structural body according to Item 12 of the present disclosure includes a first unit structural body and a second unit structural body positioned on the first unit structural body.

Each of the first unit structural body and the second unit structural body includes a first dielectric layer and a second dielectric layer which is in contact with the first dielectric layer and which has a refractive index different from a refractive index of the first dielectric layer.

The second dielectric layer includes at least two dielectric films different in hydrogen concentration from each other.

The interface between the first dielectric layer and second dielectric layer in the first unit structural body and the interface between the first dielectric layer and second dielectric layer in the second unit structural body each have periodic first irregularities and the interface between the first unit structural body and the second unit structural body has periodic fourth irregularities.

The first irregularities and the fourth irregularities have the same periodicity.

Item 13
In the structural body specified in Item 12,
the number of the at least two dielectric films included in the second dielectric layer in the first unit structural body may be different from the number of the at least two dielectric films included in the second dielectric layer in the second unit structural body.

Item 14
An imaging device according to Item 14 of the present disclosure includes
the structural body specified in any one of Items 1 to 13 and
a solid-state imaging element.
The structural body is integral with the solid-state imaging element.

Item 15
In the imaging device specified in Item 14,
the structural body may include a light-shielding film including light-shielding sections arranged in a checker pattern or a stripe pattern.

Item 16
In the imaging device specified in Item 15,
the solid-state imaging element may include
light-receiving sections and
microlenses facing the light-receiving sections.

Item 17
In the imaging device specified in Item 16,
the solid-state imaging element may further include a first planarizing layer positioned between the light-receiving sections and the microlenses.

Item 18
The imaging device specified in any one of Items 14 to 17 may further include
a second planarizing layer positioned between the solid-state imaging element and the structural body.

Item 19
In the imaging device specified in any one of Items 14 to 18,
the solid-state imaging element may include
charge accumulators,
a wiring layer on the charge accumulators, and
a photoelectric conversion film on the wiring layer.

Item 20
A method for manufacturing a structural body according to Item 20 of the present disclosure includes
preparing a substrate having a principal surface and periodic irregularities thereon,
forming a first dielectric layer on the principal surface by a chemical vapor deposition process, and
forming a second dielectric layer having a refractive index different from that of the first dielectric layer on the principal surface by the chemical vapor deposition process.
Forming the second dielectric layer includes
forming a first dielectric film in such a state that a bias power is applied to the substrate and
forming a second dielectric film on the first dielectric film in such a state that the bias power is not applied to the substrate.

Item 21
In the method for manufacturing the structural body specified in Item 20,
the chemical vapor deposition process may be a high-density plasma chemical vapor deposition process;
the first dielectric film may be formed using a source gas containing monosilane and ammonia; and
the second dielectric film may be formed using a source gas containing monosilane, ammonia, and argon.

Item 22
In the method for manufacturing the structural body specified in Item 20 or 21,
the treatment temperature of the chemical vapor deposition process when the first dielectric layer and the second dielectric layer are formed may be 200° C. or lower.

A structural body according to an embodiment of the present disclosure includes a first dielectric layer and a second dielectric layer. The first dielectric layer and the second dielectric layer are in contact with each other. The second dielectric layer has a refractive index different from that of the first dielectric layer. The second dielectric layer includes at least two dielectric films different in hydrogen concentration from each other. The interface between the first dielectric layer and the second dielectric layer has periodic irregularities. The periodic irregularities include a plurality of one- or two-dimensionally periodically arranged convex portions and/or concave portions. The periodic irregularities may be at least partly periodic structures and need not be periodic over a layer. The periodic irregularities function as a grating. This enables the first dielectric layer or the second dielectric layer to function as an optical waveguide layer.

The at least two dielectric films, which are different in hydrogen concentration from each other, typically have the same refractive index. The term "the same refractive index" as used herein means that the difference between the refractive indexes measured at a wavelength of 633 nm by ellipsometry is less than 0.1.

In typical, the refractive index of the second dielectric layer is higher than the refractive index of the first dielectric layer. In this case, the first dielectric layer may be referred to as a "low-refractive index layer" and the second dielectric layer may be referred to as a "high-refractive index layer". Such a structure allows the second dielectric layer to function as an optical waveguide layer.

First dielectric layers and second dielectric layers may be alternately stacked. In an embodiment, a plurality of combinations of the first dielectric layers and the second dielectric layers are stacked. In this case, the structural body has a structure in which at least two unit structural bodies are stacked. The term "unit structural body" as used herein refers to a structural body including a combination of the first dielectric layer and the second dielectric layer. Alternately stacking the first dielectric layers and the second dielectric layers allows the interfaces between the first dielectric layers and the second dielectric layers and the interface between neighboring two unit structural bodies to have periodic irregularities having the same periodicity. The term "interface between neighboring two unit structural bodies" refers to the interface between a second dielectric layer in one of the two unit structural bodies and a first dielectric layer in the other of the two unit structural bodies. The irregularities of these interfaces function as gratings. Such a structure embodies a structural body including a plurality of optical waveguide layers.

The at least two dielectric films in the second dielectric layer are made of the same material. However, the at least two dielectric films in the second dielectric layer have different hydrogen contents. The term "hydrogen content" refers to the amount of hydrogen contained per unit volume. Since the hydrogen contents of the at least two dielectric films in the second dielectric layer are different, the at least two dielectric films in the second dielectric layer are different in quality.

The structural body can be prepared by, for example, a chemical vapor deposition process such as a high-density plasma chemical vapor deposition (HDP-CVD) process. A plurality of films having different hydrogen concentrations can be prepared by adjusting the bias power applied to a substrate in a plasma CVD process.

The first dielectric layer may be, for example, a silicon oxide ($SiO_2$) film. Each dielectric film in the second dielectric layer may be, for example, a silicon nitride (SiN) film. Using such general semiconductor materials enables source gases with low vapor pressure to be used. Using the plasma CVD process to form silicon nitride films enables the silicon nitride films to be formed at a lower temperature as compared to a method for forming a tantalum oxide ($Ta_2O_5$) film with a similar refractive index.

According to an embodiment of the present disclosure, a surface of a film with a relatively low hydrogen concentration is etched by sputter etching in a step of forming a film with a relatively high hydrogen concentration. This allows a slope portion of the etched surface of the film with a relatively low hydrogen concentration, the slope portion having a semicircular cross section, to be chamfered. This enables, for example, saw-toothed periodic irregularities to be formed. The film with a relatively high hydrogen concentration reduces the stress of a film. Therefore, delamination can be suppressed and the occurrence of particles can be suppressed.

The at least two dielectric films in the second dielectric layer may include a first silicon nitride film and a second silicon nitride film thinner than the first silicon nitride film. The second silicon nitride film has a higher Si—H bond concentration or a higher hydrogen concentration as compared to the first silicon nitride film. The Si—H bond concentration can be measured with a Fourier transform infrared spectrometer (FTIR). The hydrogen concentration can be measured by secondary ion mass spectrometry (SIMS). Measuring these concentrations enables the change in quality of a film to be regularly controlled on a wafer level with a high-density plasma CVD system.

A method for manufacturing the structural body includes, for example, steps below.

A step of preparing a substrate having periodic irregularities.

A step of forming the first dielectric layer on the substrate.

A step of forming the second dielectric layer, which has a refractive index different from that of the first dielectric layer, on the substrate.

The step of forming the second dielectric layer includes, for example, sub-steps below.

A sub-step of forming the first dielectric film in such a state that a bias power is applied to the substrate.

A sub-step of forming the second dielectric film on the first dielectric film in such a state that the bias power is not applied to the substrate.

This method enables a high-quality structural body to be manufactured. In a step of applying no bias power, the thickness of a plurality of convex portions on a surface of the first dielectric layer can be inhibited from being reduced by an ion component. In a step of applying a bias power, a semicircular slope portion of the first dielectric film, which has been formed with no bias, is chamfered. This enables good saw-toothed periodic irregularities to be formed. Furthermore, a film with a hydrogen concentration higher than that of a film formed in a bias-free step is formed on a surface and therefore the stress is suppressed, thereby suppressing delamination.

A source gas used in the sub-step of forming the first dielectric film may contain, for example, monosilane ($SiH_4$) and ammonia ($NH_3$). A source gas used in the sub-step of forming the second dielectric film may contain, for example, $SiH_4$, $NH_3$, and argon (Ar).

A source gas used in a bias-free step has no sputter-etching effect. Therefore, convex portions of periodic irregularities are not etched and the height of the convex portions is not reduced. However, a source gas used in a step of applying a bias power contains Ar, which is a rare gas, and therefore has a sputter-etching effect. This allows a surface of the first dielectric film to be semicircularly chamfered. Applying a bias power allows hydrogen ions in plasma to be attracted to a silicon nitride film and provides a stress relaxation effect.

According to the above manufacturing method, the treatment temperature of the chemical vapor deposition process when the first dielectric layer and the second dielectric layer are formed can be set to, for example, 200° C. or lower. Therefore, when an imaging device is manufactured by integrating, for example, the structural body with a solid-state imaging element, an organic material can be used to form a microlens and a planarizing layer. Treatment at 200° C. or lower enables the deformation of the structural body due to heat during deposition to be prevented even if the organic material is used.

Exemplary embodiments of the present disclosure are described below with reference to drawings. Unnecessarily detailed descriptions are omitted in some cases. For example, a detailed description of an already well-known item and a duplicate description about substantially the same configuration are omitted in some cases. This is for the purpose of avoiding the unnecessary redundancy of descriptions below to facilitate the understanding of those skilled in the art. The inventors provide the attached drawings and the descriptions below such that those skilled in the art sufficiently understand the present disclosure. These are not intended to limit the subject matter recited in the claims.

First Embodiment

A structural body according to a first embodiment of the present disclosure and a method for manufacturing the same are described. The structural body can be manufactured by a chemical vapor deposition process such as a high-density plasma chemical vapor deposition (HDP-CVD) process. A method for manufacturing the structural body by the HDP-CVD process and an example of deposition conditions are described below.

FIG. 1 is a schematic view showing the configuration of a high-density plasma CVD system 1 used to manufacture the structural body. The high-density plasma CVD system 1 includes a vacuum vessel 2, a radio-frequency (RF) antenna 5 placed on an upper portion of the vacuum vessel 2, and a lower electrode 8 placed on a lower portion of the vacuum vessel 2. The RF antenna 5 is connected to a radio-frequency power supply 4A. An upper side surface of the vacuum vessel 2 is provided with a source gas supply nozzle 3 and a lower portion thereof is provided with a vent 9 connected to a vacuum device 10. An inside lower portion of the vacuum vessel 2 is provided with the lower electrode 8. The lower electrode 8 supports a substrate 7 (for example, a silicon substrate). The lower electrode 8 is connected to a radio-frequency power supply 4B so as to be capable of applying a bias power. Hereinafter, applying a bias power to the lower electrode 8 from the radio-frequency power supply 4B is referred to as "bias application" in some cases. The high-density plasma CVD system 1 also includes a mechanism that changes the distance H between the RF antenna 5 and the lower electrode 8.

Plasma 6 is generated by applying a radio-frequency voltage to the RF antenna 5 from the radio-frequency power supply 4A. Ions in the plasma 6 can be attracted to the lower electrode 8 side by applying a bias power to the lower electrode 8. This enables a thin film of a dielectric to be formed on the substrate 7.

FIGS. 2A to 2M are schematic sectional views sequentially showing steps of manufacturing the structural body. The structural body is finally prepared as shown in FIG. 2M using the high-density plasma CVD system 1, which is shown in FIG. 1. The structural body has a structure in which first dielectric layers having a relatively low refractive index and second dielectric layers having a relatively low refractive index are alternately stacked. Supposing that a combination of a first dielectric layer and second dielectric layer in contact with each other is a single unit structural body, the structural body has a structure in which a plurality of unit structural bodies are stacked as shown in FIG. 2M. Herein, the first dielectric layers are referred to as the "low-refractive index layers" and the second dielectric layers are referred to as the "high-refractive index layers" in some cases. The interface between each of the low-refractive index layers and a corresponding one of the high-refractive index layers is provided with substantially periodic irregularities functioning as a grating. This allows light to propagate inside the high-refractive index layers. The structural body can be used as an optical waveguide layer in a photodetector disclosed in U.S. Patent Application Publication Nos. 2016/360967 and 2017/023410.

In this embodiment, each high-refractive index layer is composed of a composite including a plurality of films having different hydrogen concentrations. This enables delamination and the occurrence of particles to be suppressed as described below and also enables an irregular shape to be sharpened.

In this embodiment, each low-refractive index layer is composed of a silicon oxide film and each high-refractive index layer is composed of a composite of silicon nitride films. The silicon oxide film has a refractive index of 1.44 to 1.47. The silicon nitride films have a refractive index of 1.90 to 2.20. This configuration can meet conditions for the optimum effective refractive index for generating guided light in a high-refractive index layer disclosed in each of U.S. Patent Application Publication Nos. 2016/360967 and 2017/023410.

An example of a procedure for manufacturing the structural body is described below.

Figure 2A:
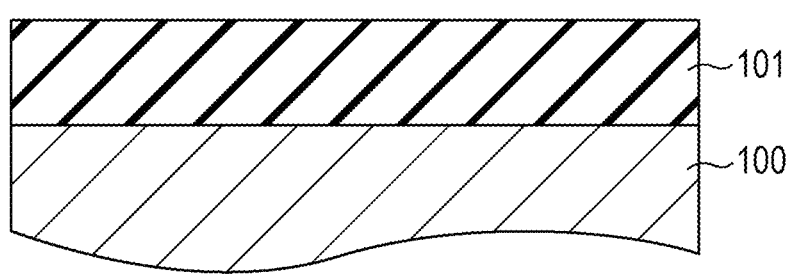
FIG. 2A is a first view showing a step of manufacturing the structural body according to the first embodiment.

First, as shown in FIG. 2A, a silicon oxide film (SiO$_2$ film) 101 that is a layer of a dielectric material having a relatively low refractive index is formed on a silicon substrate 100. The silicon oxide film 101 may have a thickness of, for example, about 1,000 nm to 1,500 nm. The thickness of the silicon oxide film 101 is determined depending on the design of an optical device equipped with the structural body. The silicon oxide film 101 has a refractive index of 1.44 to 1.47. The term "refractive index" as used herein refers to the refractive index determined by ellipsometry using light with a wavelength of 633 nm.

In a step of forming the silicon oxide film 101 on the silicon substrate 100, a source gas used may be a gas mixture of monosilane (SiH$_4$) and oxygen (O$_2$). The gas mixture is supplied into the vacuum vessel 2 from the source gas supply nozzle 3 as shown in FIG. 1. In this step, for example, the flow rate of a SiH$_4$ gas may be set to 50 sccm, the flow rate of an O$_2$ gas may be set to 100 sccm, the pressure may be set to 7.0 Pa, the RF power may be set to 3,000 W, the bias power may be set to 0 W, and the treatment temperature may be set to 170° C. This allows the silicon oxide film 101 to be formed such that the silicon oxide film 101 has the above refractive index and thickness. Combining SiH$_4$, which is common as a semiconductor material gas and has high vapor pressure, with plasma chemical vapor deposition enables deposition at low temperature (for example, 200° C. or lower). The unused source gas is sucked and is discharged from the vent 9, which is connected to the vacuum device 10.

Figure 2B:
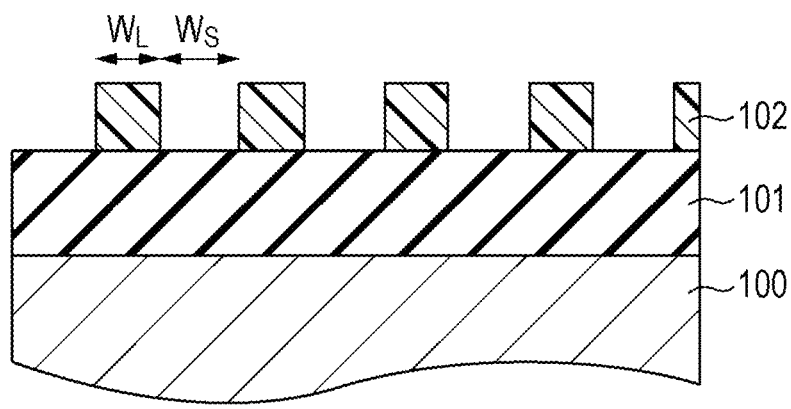
FIG. 2B is a second view showing a step of manufacturing the structural body according to the first embodiment.

Next, as shown in FIG. 2B, a resist pattern 102 with a rectangular shape in plan view is formed on the silicon oxide film 101 by photolithography. Hereinafter, a place covered by a resist is referred to as a "line" and a place not covered by the resist is referred to as a "space". The width WL of lines and the width Ws of spaces may be set to, for example, about 200 nm. The periodicity (also referred to as "pitch") of the lines and the spaces is, for example, about 400 nm. The pitch is appropriately determined depending on the wavelength of a light source used in a prepared optical device and the refractive index of a dielectric material used therein.

Figure 2C:
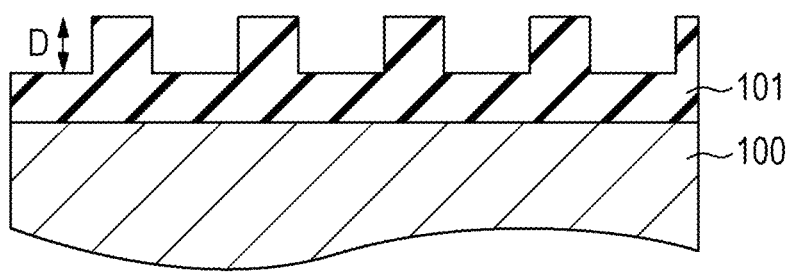
FIG. 2C is a third view showing a step of manufacturing the structural body according to the first embodiment.

Next, the silicon oxide film 101 is partly etched by, for example, a dry etching process using the resist pattern 102 as a mask. In particular, portions of the resist pattern 102 that are not covered by the resist pattern 102 are removed by, for example, about 200 nm to 300 nm. This allows a periodic trench pattern with a depth D of about 200 nm to 300 nm to be formed in the silicon oxide film 101 as shown in FIG. 2C. The depth D of the trench pattern is less than the thickness of the silicon oxide film 101.

Etching conditions are, for example, as described below. A dry etching system used is a plasma etcher with a reduced interelectrode distance. Etching gases used are three types of gases: tetrafluorocarbon (CF$_4$), trifluoromethane (CHF$_3$), and argon (Ar). For plasma etching conditions, for example, the flow rate of a CF$_4$ gas may be set to 20 sccm to 30 sccm, the flow rate of a CHF$_3$ gas may be set to 20 sccm to 30 sccm, the flow rate of an Ar gas may be set to 300 sccm, the pressure in a chamber may be set to 1 Pa to 30 Pa, and the plasma power may be set to 1,000 W to 1,500 W. Under these conditions, the silicon oxide film 101 is etched.

In this case, CF$_4$ and CHF$_3$ are etching gases. As is clear from the following reaction equation, a main etchant is F* (radical) generated from CF$_4$:

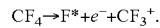

$$CF_4 \rightarrow F^* + e^- + CF_3^+.$$

When the silicon oxide film 101 is etched, CHF$_3$ covers the walls of grooves in the trench pattern with the polymer C$_X$H$_Y$F$_Z$ to play a role in the protection of the walls of the grooves. This enables the trench pattern to be formed such that the pitch of the lines and the spaces is, for example, 0.5 μm or less.

Thereafter, ashing (resist stripping) and sulfuric acid-hydrogen peroxide mixture (SPM) cleaning are carried out for the purpose of removing the resist pattern 102, which is used as an etching mask. This enables the trench pattern to be formed in the silicon oxide film 101 such that the trench pattern has periodic irregularities and the lines and the spaces have a width of, for example, 200 nm and a depth of 200 nm to 300 nm.

Figure 2D:
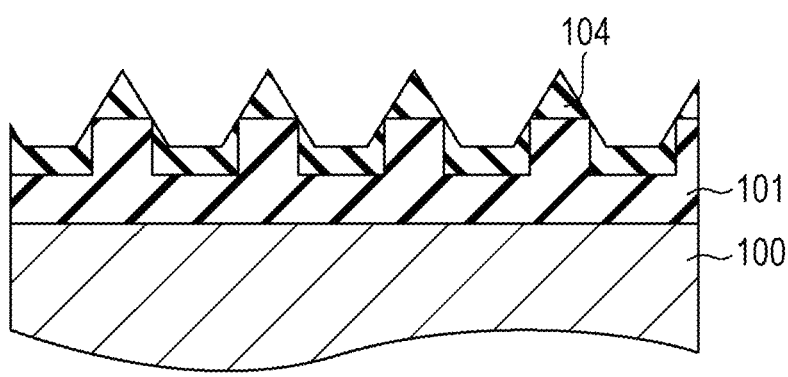
FIG. 2D is a fourth view showing a step of manufacturing the structural body according to the first embodiment.

Next, as shown in FIG. 2D, a silicon oxide film 104 is formed so as to fill the grooves in the trench pattern, which has the periodic irregularities. The silicon oxide film 104 has a thickness of, for example, about 200 nm. The silicon oxide film 104 has a refractive index of 1.44 to 1.47. An example of conditions for forming the silicon oxide film 104 by the HDP-CVD process is as described below. A reaction gas used is a gas mixture of monosilane ($SiH_4$), oxygen ($O_2$), and argon (Ar). The flow rate of a $SiH_4$ gas may be set to 50 sccm. The flow rate of an $O_2$ gas may be set to 100 sccm. The flow rate of an Ar gas may be set to 20 sccm. The pressure may be set to 5.0 Pa. The RF power may be set to 2,000 W. The bias power may be set to 1,000 W. The treatment temperature may be set to 170° C. In the formation of the silicon oxide film 104 by the HDP-CVD process, etching and deposition proceed at the same time. Therefore, the silicon oxide film 104 is partly flatly deposited on recessed portions of the trench pattern and is deposited on protruding portions of the trench pattern so as to form slopes inclined at, for example, 45 degrees from edges of the recessed portions. This allows the silicon oxide film 104 to be formed such that the silicon oxide film 104 has periodic irregularities with sharp tops.

Figure 2E:
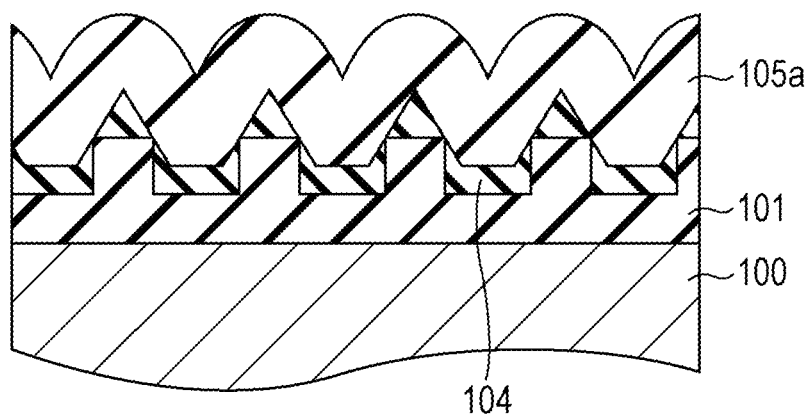
FIG. 2E is a fifth view showing a step of manufacturing the structural body according to the first embodiment.
Figure 2F:
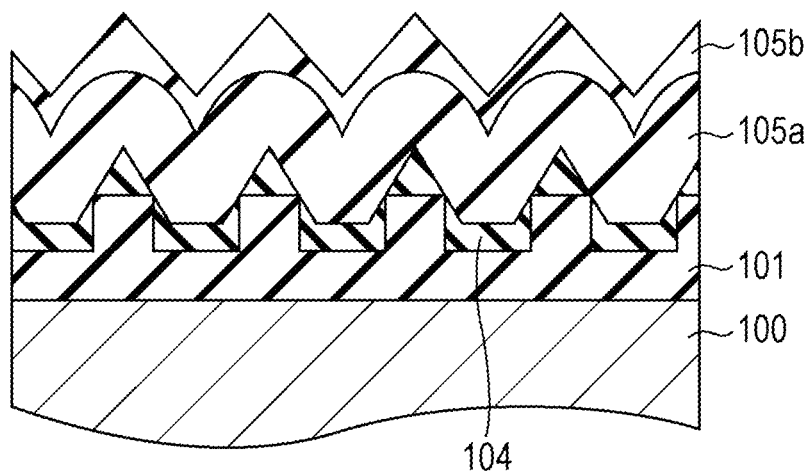
FIG. 2F is a sixth view showing a step of manufacturing the structural body according to the first embodiment.

Next, as shown in FIGS. 2E and 2F, silicon nitride (SiN) films 105a and 105b are deposited in sequence on the silicon oxide film 104. The silicon nitride film 105b contains more hydrogen than the silicon nitride film 105a. A composite of the silicon nitride films 105a and 105b forms a high-refractive index layer.

There are two reasons why SiN is selected as material for high-refractive index layers. A first reason is that a film can be formed using a gaseous material, generally used in the semiconductor field, having low vapor pressure. A second reason is that a film can be formed by plasma chemical vapor deposition at a relatively low temperature (for example, 200° C. or lower). Instead of a silicon nitride film, tantalum oxide ($Ta_2O_5$), which has a similar refractive index, can be deposited by a CVD process or a sputtering process. However, in a case where the $Ta_2O_5$ film is formed by the CVD process, a high-vapor pressure material needs to be used and therefore the treatment temperature needs to be increased from about 400° C. to 500° C. In a case where the $Ta_2O_5$ film is formed by the sputtering process, depositing material at low temperature causes a reduction in refractive index and therefore the treatment temperature usually needs to be increased from about 300° C. to 400° C. From the above reasons, in this embodiment, SiN is selected as material for high-refractive index layers.

The silicon nitride films 105a and 105b are different in quality from each other. First, as shown in FIG. 2E, the silicon nitride film 105a is formed in such a state that no bias power is applied. The silicon nitride film 105a may have a thickness of, for example, about 310 nm. The silicon nitride film 105a has a refractive index of 1.90 to 2.20. Deposition conditions in this step are, for example, as described below. A source gas used is a gas mixture of monosilane ($SiH_4$) and ammonia ($NH_3$). The flow rate of a $SiH_4$ gas may be set to 60 sccm. The flow rate of an $NH_3$ gas may be set to 80 sccm. The pressure may be set to 5.0 Pa. The RF power may be set to 4,000 W. The bias power may be set to 0 W. The treatment temperature may be set to 170° C. Forming the silicon nitride film 105a under these conditions allows the silicon nitride film 105a to have a semicircular shape in cross section. If the silicon nitride film 105a is sequentially formed under the above conditions, then neighboring convex portions of the silicon nitride film 105a are connected to each other and therefore no periodic irregular shape can be formed.

Therefore, in this embodiment, after the silicon nitride film 105a, which has a semicircular cross section, is formed, the silicon nitride film 105b is formed by applying a bias power. The silicon nitride film 105a may have a thickness of, for example, about 40 nm. The silicon nitride film 105a has a refractive index of about 1.90 to 2.20 too. Deposition conditions in this operation are, for example, as described below. A source gas used is a gas mixture of monosilane ($SiH_4$), ammonia ($NH_3$), and argon (Ar). The flow rate of a $SiH_4$ gas may be set to 23 sccm. The flow rate of an $NH_3$ gas may be set to 29 sccm. The flow rate of an Ar gas may be set to 10 sccm. The pressure may be set to 5.0 Pa. The RF power may be set to 1,500 W. The bias power may be set to 2,400 W. The treatment temperature may be set to 170° C. Forming the silicon nitride film 105b by applying the bias power allows semicircular side surface portions of the silicon nitride film 105a, which has been formed with no bias, to be scraped by sputter etching. On the other hand, the silicon nitride film 105b is formed in the vicinity of the bottoms of the recessed portions and the tops of the protruding portions. As a result, an irregular shape is reproduced on a surface of a composite of the silicon nitride films 105a and 105b in such a form that a periodic irregular shape shown in FIG. 2D is followed.

The refractive indexes of the silicon nitride films 105a and 105b are substantially equal. The refractive indexes thereof are equal down to the second decimal place as measured with, for example, an optical measurement system by ellipsometry. Such a configuration has an advantage that the loss of light propagation can be suppressed in a case where an optical device using the silicon nitride films 105a and 105b as optical waveguide layers is configured.

Figure 2G:
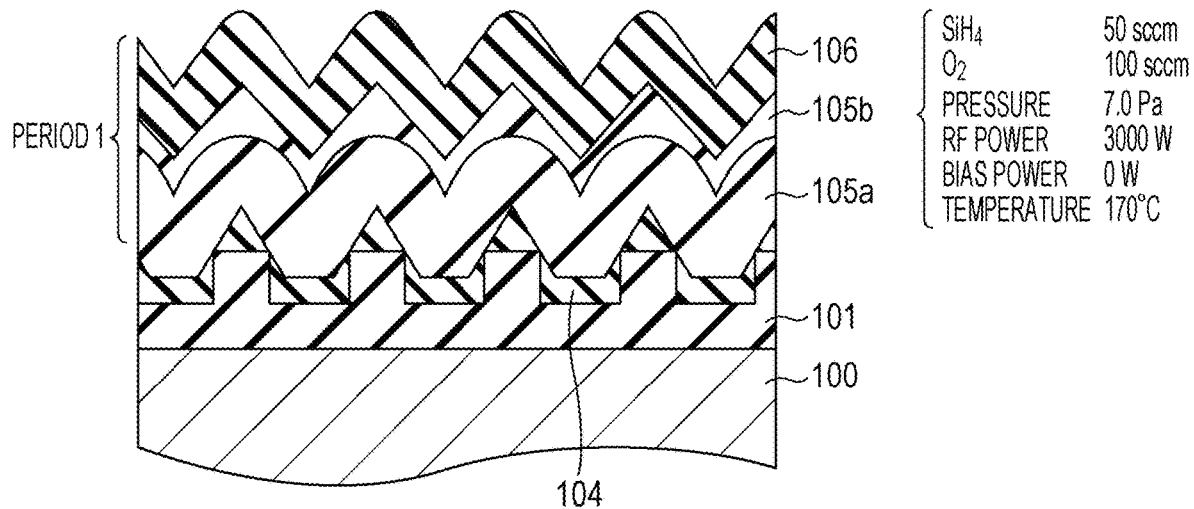
FIG. 2G is a seventh view showing a step of manufacturing the structural body according to the first embodiment.

Next, as shown in FIG. 2G, a silicon oxide film 106 is formed. The silicon oxide film 106 may have a thickness of, for example, about 220 nm. The silicon oxide film 106 has a refractive index of 1.44 to 1.47. An example of deposition conditions is as described below. A source gas used is a gas mixture of monosilane ($SiH_4$) and oxygen ($O_2$). The flow rate of a $SiH_4$ gas may be set to 50 sccm. The flow rate of an $O_2$ gas may be set to 100 sccm. The pressure may be set to 7.0 Pa. The RF power may be set to 3,000 W. The bias power may be set to 0 W. The treatment temperature may be set to 170° C.

When the thickness of the silicon oxide film 106 that is required in a device is large, silicon oxide films may be formed in such a state that a bias power is applied like conditions for forming the silicon oxide film 104 as shown in FIG. 2D. In this case, silicon oxide films, as well as a silicon nitride film, form a composite.

As shown in FIG. 2G as "Period 1", a combination of the silicon nitride films 105a and 105b and silicon oxide film 106 formed through steps shown in FIGS. 2E to 2G is set to one period. In this embodiment, the structural body is formed by stacking a plurality of periods of such combinations.

An example of deposition conditions in the second and subsequent periods is described below.

Figure 2H:
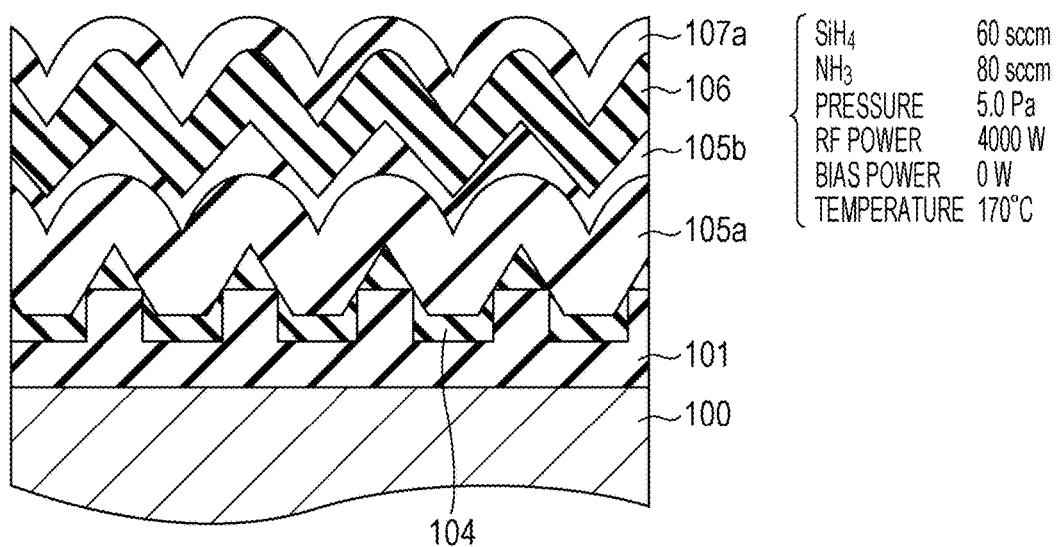
FIG. 2H is an eighth view showing a step of manufacturing the structural body according to the first embodiment.

First, as shown in FIG. 2H, a silicon nitride film 107a is formed under conditions excluding bias application. The silicon nitride film 107a may be formed so as to have a thickness of, for example, about 80 nm. The silicon nitride film 107a has a refractive index of 1.90 to 2.20. Deposition conditions are, for example, as described below. A source gas used is a gas mixture of monosilane ($SiH_4$) and ammonia ($NH_3$). The flow rate of a $SiH_4$ gas may be set to 60 sccm. The flow rate of an $NH_3$ gas may be set to 80 sccm. The pressure may be set to 5.0 Pa. The RF power may be set to 4,000 W. The bias power may be set to 0 W. The treatment temperature may be set to 170° C.

Figure 2I:
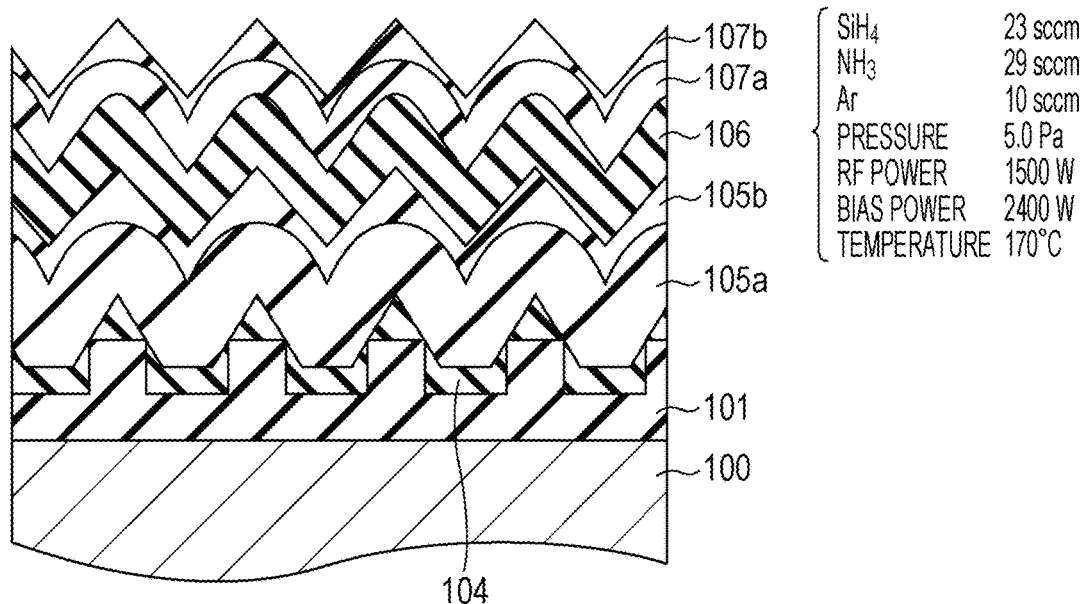
FIG. 2I is a ninth view showing a step of manufacturing the structural body according to the first embodiment.

Subsequently, as shown in FIG. 2I, a silicon nitride film 107b is formed under conditions including bias application. The silicon nitride film 107b may be formed so as to have a thickness of, for example, about 40 nm. The silicon nitride film 107b has a refractive index of 1.90 to 2.20 too. Deposition conditions are, for example, as described below. A source gas used is a gas mixture of monosilane (SiH$_4$), ammonia (NH$_3$), and argon (Ar). The flow rate of a SiH$_4$ gas may be set to 23 sccm. The flow rate of an NH$_3$ gas may be set to 29 sccm. The flow rate of an Ar gas may be set to 10 sccm. The pressure may be set to 5.0 Pa. The RF power may be set to 1,500 W. The bias power may be set to 2,400 W. The treatment temperature may be set to 170° C. In this film formation, semicircular side surface portions of the silicon nitride film 107a, which has been formed under bias-free conditions, is scraped by sputter etching and is chamfered.

Figure 2J:
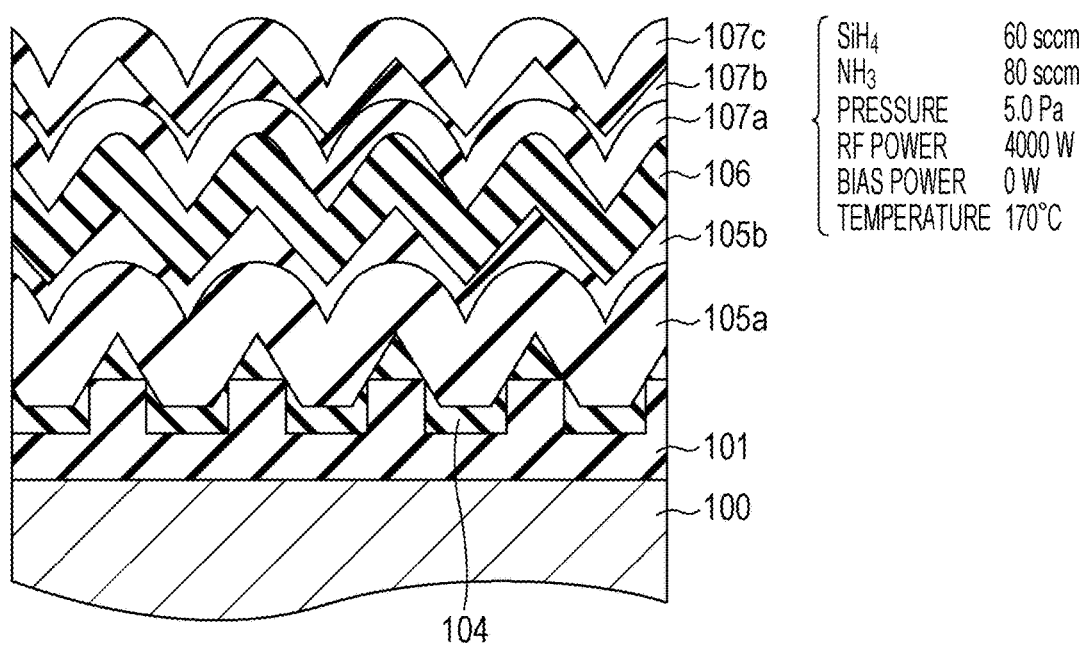
FIG. 2J is a tenth view showing a step of manufacturing the structural body according to the first embodiment.

Next, as shown in FIG. 2J, a silicon nitride film 107c is formed under conditions excluding bias application so as to have a thickness of, for example, 190 nm. The silicon nitride film 107c has a refractive index of 1.90 to 2.20 too. An example of deposition conditions is as described below. A source gas used is a gas mixture of monosilane (SiH$_4$) and ammonia (NH$_3$). The flow rate of a SiH$_4$ gas may be set to 60 sccm. The flow rate of an NH$_3$ gas may be set to 80 sccm. The pressure may be set to 5.0 Pa. The RF power may be set to 4,000 W. The bias power may be set to 0 W. The treatment temperature may be set to 170° C.

Figure 2K:
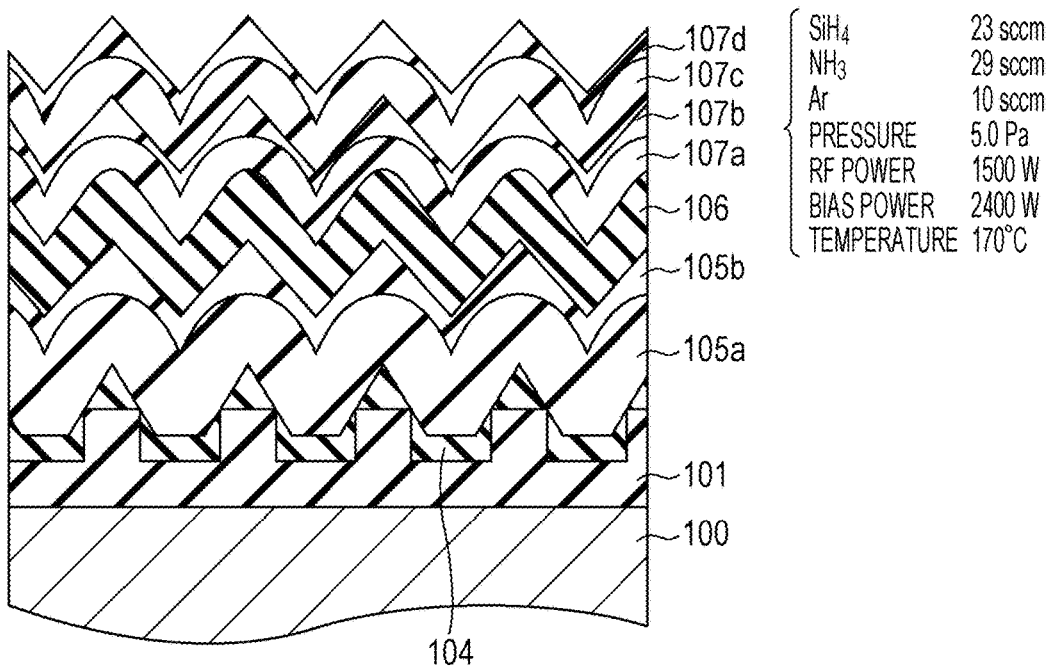
FIG. 2K is an eleventh view showing a step of manufacturing the structural body according to the first embodiment.

Subsequently, as shown in FIG. 2K, a silicon nitride film 107d is formed so as to have a thickness of, for example, 40 nm under conditions including bias application. The silicon nitride film 107d has a refractive index of 1.90 to 2.20 too. An example of deposition conditions in this operation is as described below. A source gas used is a gas mixture of monosilane (SiH$_4$), ammonia (NH$_3$), and argon (Ar). The flow rate of a SiH$_4$ gas may be set to 23 sccm. The flow rate of an NH$_3$ gas may be set to 29 sccm. The flow rate of an Ar gas may be set to 10 sccm. The pressure may be set to 5.0 Pa. The RF power may be set to 1,500 W. The bias power may be set to 2,400 W. The treatment temperature may be set to 170° C. In this film formation, semicircular side surface portions of the silicon nitride film 107c, which has been formed under bias-free conditions, is scraped by sputter etching and is chamfered.

Figure 2L:
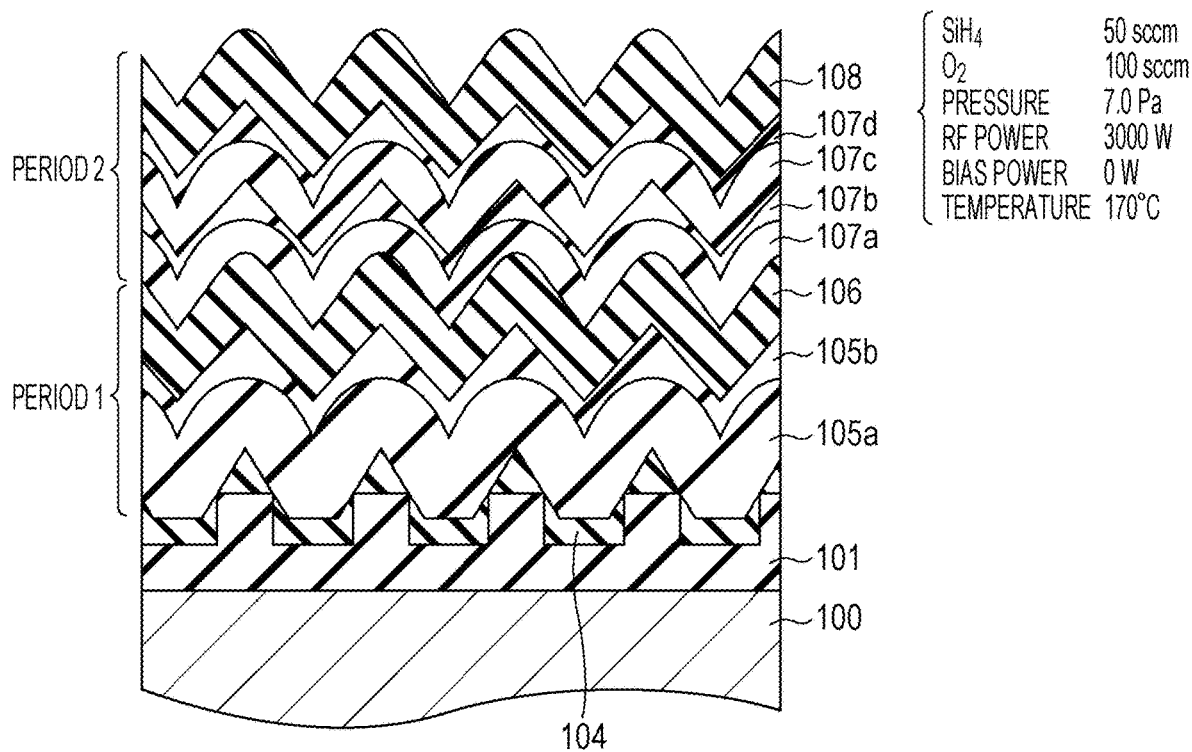
FIG. 2L is a twelfth view showing a step of manufacturing the structural body according to the first embodiment.
Figure 2M:
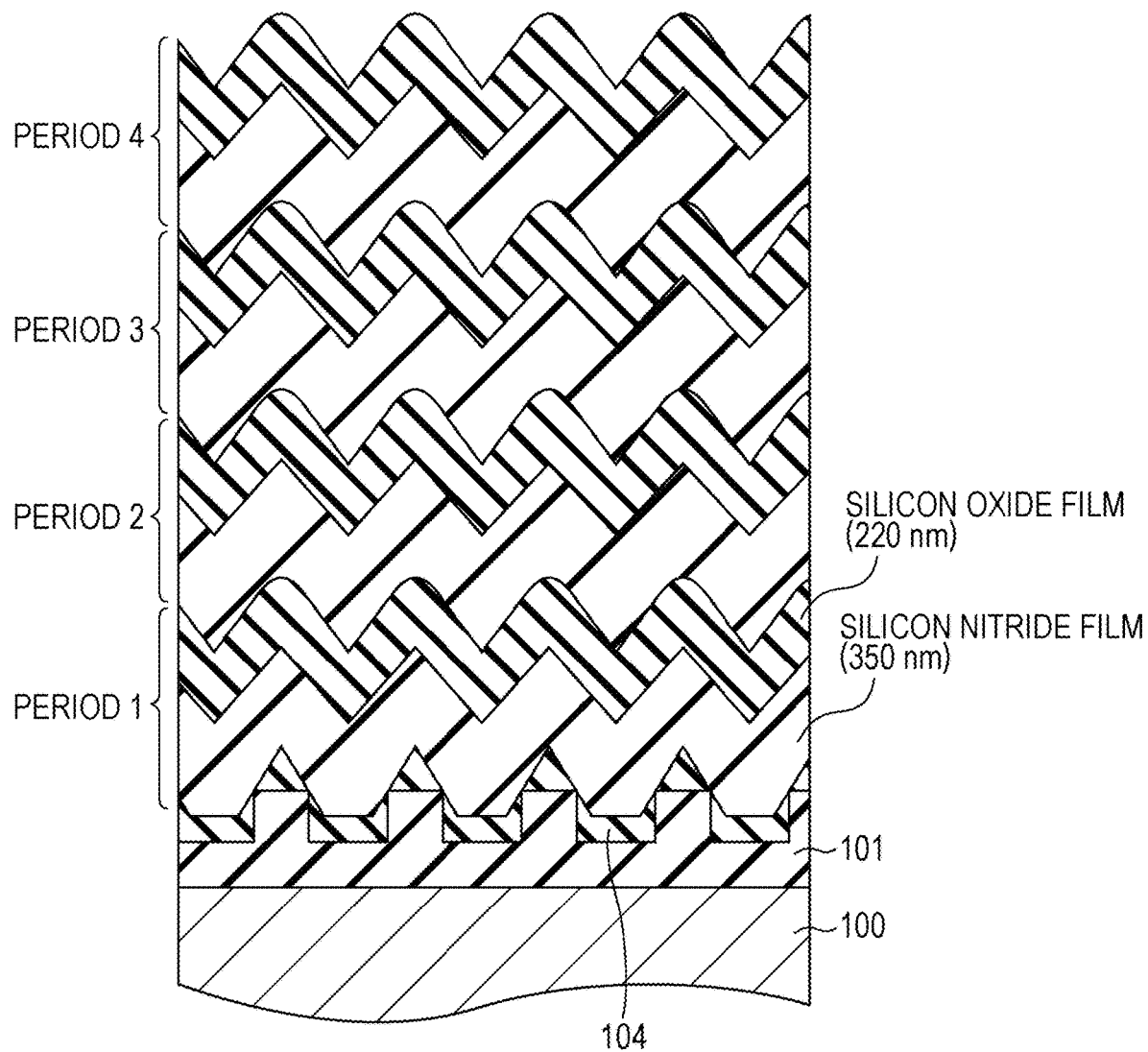
FIG. 2M is a schematic view showing a cross section of a structural body prepared in an experiment.

Next, as shown in FIG. 2L, a silicon oxide film 108 is formed so as to have a thickness of, for example, 220 nm. The silicon oxide film 108 has a refractive index of 1.44 to 1.47. An example of deposition conditions is as described below. A reaction gas used is a gas mixture of monosilane (SiH$_4$) and oxygen (O$_2$). The flow rate of a SiH$_4$ gas may be set to 50 sccm. The flow rate of an O$_2$ gas may be set to 100 sccm. The pressure may be set to 7.0 Pa. The RF power may be set to 3,000 W. The bias power may be set to 0 W. The treatment temperature may be set to 170° C.

When the thickness of the silicon oxide film 108 that is required in a device is large, a silicon oxide film may be further formed in such a state that the bias power is applied like conditions for forming the silicon oxide film 104 shown in FIG. 2D such that a composite is obtained.

Herein, the silicon oxide film 101 corresponds to a third dielectric layer in the present disclosure; the silicon oxide film 104 corresponds to a fourth dielectric layer in the present disclosure; each of the silicon nitride films 105a, 105b, 107a, 107b, 107c, and 107d corresponds to a second dielectric layer in the present disclosure; and each of the silicon nitride film 106 and 108 corresponds to a first dielectric layer in the present disclosure. Furthermore, each of the silicon nitride films 105a, 107a, and 107c corresponds to a first silicon nitride film in the present disclosure and each of the silicon nitride films 105b, 107b, and 107d corresponds to a second silicon nitride film in the present disclosure.

As shown in FIG. 2L as "PERIOD 1" and "PERIOD 2", a second period of a combination of the silicon nitride films 107a, 107b, 107c, and 107d and the silicon oxide film 108 is formed. A method for forming a film in the second period is different from a method for forming a film in a first period shown in FIGS. 2E to 2G. This is because an irregular shape of a surface of the silicon oxide film 106, on which the silicon nitride film 107a is formed, is different from that in the first period. In film formation in the first period, surface concave portions of the silicon oxide film 104 have a horizontal region. Therefore, though the silicon nitride film 105a, which has a thickness of 310 nm, is formed on the silicon oxide film 104 under bias-free conditions, the neighboring convex portions thereof are not connected to each other. However, in the second and subsequent periods, surface concave portions of the silicon oxide film 106, on which the silicon nitride film 107a is formed, have no horizontal region. Therefore, if the silicon nitride film 107a, which has a thickness of, for example, 310 nm, is formed on the silicon oxide film 106 under bias-free conditions, then neighboring convex portions are connected to each other and there are no concave portions. Thus, in this embodiment, an irregular shape due to a composite of SiN films is formed by a method shown in FIGS. 2H to 2K in the second period.

As described above, even though surface irregular shapes of dielectric layers (SiO$_2$ films in this embodiment) which are film-formed bodies are different, the height of convex portions of the structural body and the depth of concave portions thereof can be kept substantially constant by combining film formation with no bias and film formation with bias application.

In a structural body for use in an optical device, many periods, for example, four periods or more of combinations of two or more types of layers having different refractive indexes can be deposited. Therefore, in this embodiment, four periods or more of combinations of silicon nitride films and a silicon oxide film can be formed by repeating steps described with reference to FIGS. 2H to 2L.

FIG. 2M schematically shows a cross section of a structural body prepared in an experiment. As shown in FIG. 2M as "PERIOD 1", "PERIOD 2", "PERIOD 3", and "PERIOD 4", this structural body includes four periods of combinations of silicon nitride films forming a composite and a silicon oxide film. In FIG. 2M, the silicon nitride films are shown in the form of a single film for the purpose of facilitating visualization. Each silicon nitride film may have a thickness of, for example, 350 nm. Each silicon oxide film may have a thickness of, for example, 220 nm.

FIG. 3A shows an image obtained by observing a cross section of an actually prepared structural body including four periods of two types of layers having different refractive indexes with a scanning electron microscope (SEM). FIG. 3B is an enlarged view of a portion of the structural body that includes second to fourth periods shown as "PERIOD 2", "PERIOD 3", and "PERIOD 4". A semicircular conductive metal film 110 is placed uppermost for the purpose of preventing charge-up during SEM observation. As is confirmed by the SEM observation of the cross section, it has been confirmed that this structural body can be formed without delamination due to stress so as to have periodic irregularities and a sawtooth shape. In FIG. 3B, the following films are identified by shading in a SEM image: silicon nitride films 105a, 107a, and 107c formed by applying no bias power and silicon nitride films 105b, 107b, and 107d formed by applying a bias power.

Figure 4:
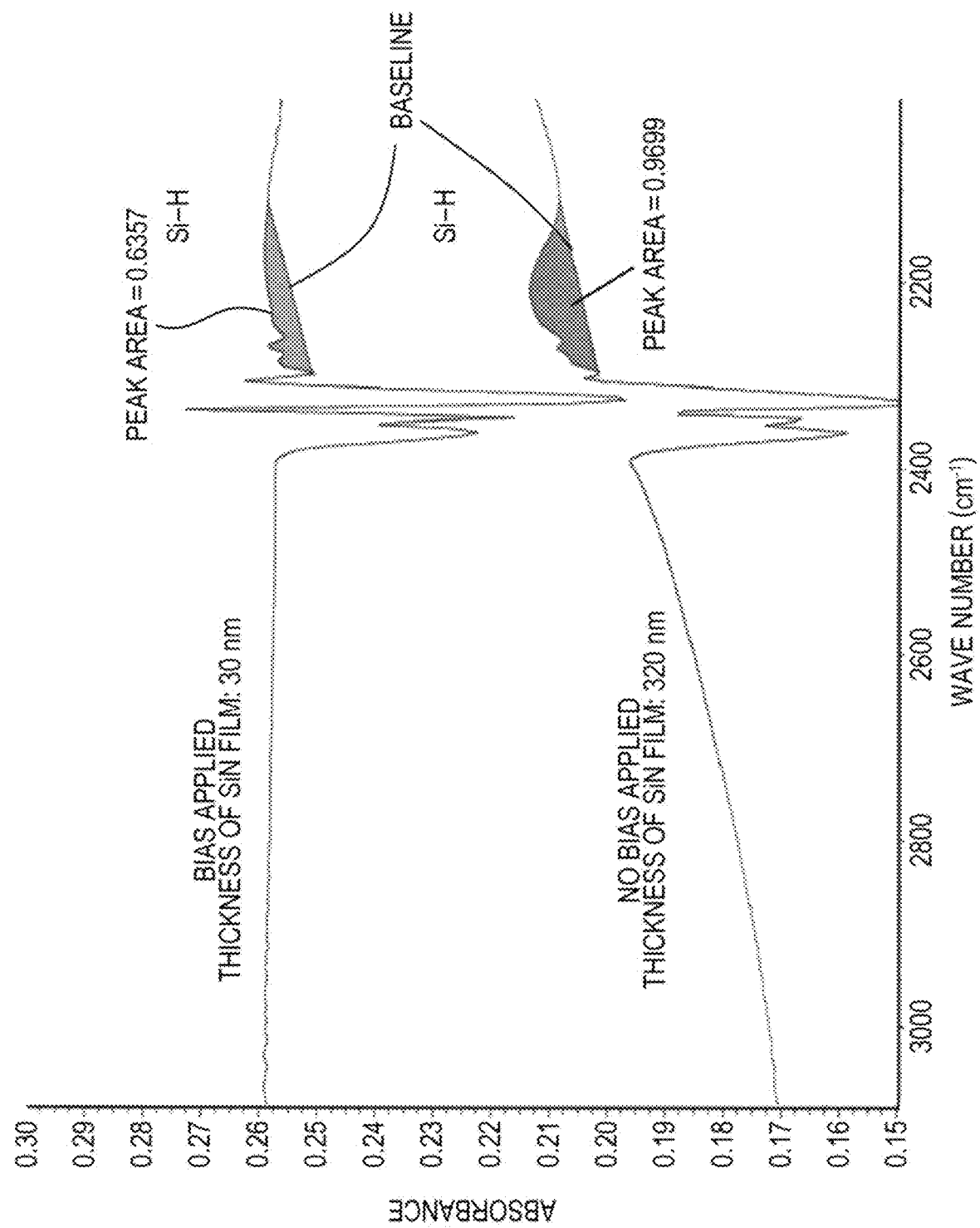
FIG. 4 is a graph showing results obtained by measuring the quality of a silicon nitride film formed by applying a bias power and the quality of a silicon nitride film formed by applying no bias power using a Fourier transform infrared spectrometer (FTIR)

FIG. 4 is a graph showing results obtained by measuring the quality of a silicon nitride film formed by applying a bias power and the quality of a silicon nitride film formed by applying no bias power using a Fourier transform infrared spectrometer (FTIR). In the graph shown in FIG. 4, the horizontal axis represents the wave number ($cm^{-1}$) of an IR spectrum and the vertical axis represents the absorbance. In this example, the silicon nitride film formed by applying a bias power of 2,400 W has a thickness of 30 nm and the silicon nitride film formed by applying no bias power has a thickness of 320 nm. For each silicon nitride film, the peak area, the Si—H bond concentration per unit area, and the Si—H bond concentration per unit volume have been calculated. Table 1 shows the calculation results.

TABLE 1

| IR measurement samples | Thickness (nm) | 2200 $cm^{-1}$ peak area | Si—H bond concentration per unit area (atoms/$cm^2$) | Si—H bond concentration per unit volume (atoms/$cm^3$) |
|---|---|---|---|---|
| Bias applied SiN (2,400 W) | 30 | 0.6357 | $8.6 \times 10^{16}$ | $2.9 \times 10^{22}$ |
| No bias applied SiN (0 W) | 320 | 0.9699 | $1.3 \times 10^{17}$ | $4.1 \times 10^{21}$ |

The Si—H bond concentration per unit area and the Si—H bond concentration per unit volume can be calculated from the peak area obtained by FTIR measurement using conversion equations below. The conversion equations are disclosed in W. A. Lanford and M. J. Rand, "The hydrogen content of plasma-deposited silicon nitride", J. Appl. Phys. vol. 49, No. 4, pp. 2473-2477 (April 1978) (herein referred to as "Lanford"). The peak area can be calculated by a method shown in FIG. 1 in the document Lanford.

Si—H bond concentration per unit area=(peak area)× $1.36 \times 10^{17}$ (an equation in Table III of the document Lanford)

Si—H bond concentration per unit volume=(Si—H bond concentration per unit area)/thickness (cm)

In an example shown in FIG. 4, the Si—H bond concentration per unit volume at a wave number of about 2,200 $cm^{-1}$ is $2.9 \times 10^{22}$ atoms/$cm^3$ in a case where a bias power is applied and is $4.1 \times 10^{21}$ atoms/$cm^3$ in a case where no bias power is applied. The reason why there is a difference in Si—H bond concentration is as described below. In a case where a radio-frequency bias power is applied to a silicon substrate, electrons generated in plasma are attracted to the silicon substrate side to create a negative potential. As a result, ions generated in plasma are attracted to the silicon substrate side and are implanted into a silicon nitride film. In particular, hydrogen atoms contained in a monosilane ($SiH_4$) gas used as a source gas are excited in a plasma reaction process and radicals and ion species including the excited hydrogen atoms are attracted to the silicon substrate side and are implanted into the silicon nitride film. However, in the case where no bias power is applied, little hydrogen is attracted to a silicon substrate. Therefore, the Si—H bond concentration per unit volume in the case where the bias power is applied is higher than that in the case where no bias power is applied.

Figure 5:
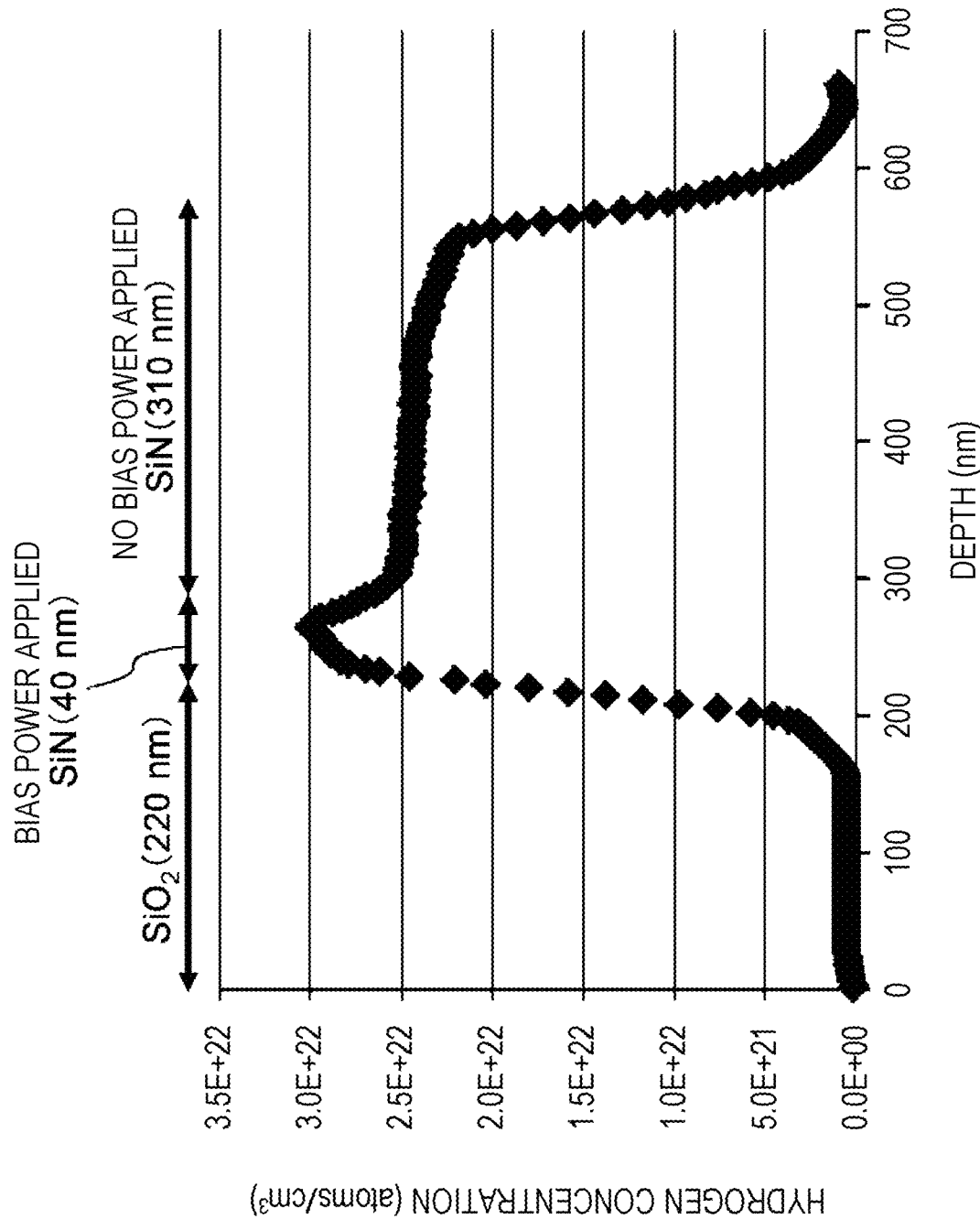
FIG. 5 is a graph showing results obtained by measuring the difference in quality between a silicon nitride film formed by applying a bias power and a silicon nitride film formed by applying no bias power by secondary ion mass spectroscopy (SIMS)

FIG. 5 is a graph showing results obtained by measuring the difference in quality between a silicon nitride film formed by applying a bias power and a silicon nitride film formed by applying no bias power by secondary ion mass spectroscopy (SIMS). Herein, the following composite was measured: a composite that was formed in such a manner that after periodic irregularities were formed as shown in FIG. 2D, a silicon nitride film was formed under a condition applying no bias power so as to have a thickness of 310 nm, a silicon nitride film was formed under a condition applying a bias power so as to have a thickness of 40 nm, and a silicon oxide film was formed so as to have a thickness of 220 nm in that order from the silicon substrate side. FIG. 5 shows results obtained by determining the concentration of hydrogen secondary ions liberated by applying primary ions to the silicon oxide film, the silicon nitride film formed by applying a bias power, and the silicon nitride film formed by applying no bias power in that order from the surface side. In FIG. 5, the horizontal axis represents the depth from a surface of the silicon oxide film and the vertical axis represents the concentration (atoms/$cm^3$) of the hydrogen secondary ions. The results shown in FIG. 5, as well as the FTIR measurement results shown in FIG. 4, reveal that a deposition condition applying a bias power gives a higher hydrogen concentration as compared to a deposition condition applying no bias power.

The fact that the silicon nitride film formed by applying a bias power has high hydrogen content provides a great advantage from the viewpoint of reliability in addition to the advantage of chamfering a semicircular portion by sputter etching. A silicon nitride film with low hydrogen content has large compressive stress. Therefore, forming a multilayer structural body with a thickness of, for example, 1 μm or more from only silicon nitride films with low hydrogen content causes delamination, generates particles, and can reduce the reliability of manufacturing devices. Increasing the content of hydrogen in a silicon nitride film reduces the density of the silicon nitride film, in which the compressive stress changes to tensile stress. Therefore, even if a multilayer structure with a thickness of 1 μm or more is formed, delamination does not occur and the generation of particles can be suppressed. Thus, the method for manufacturing the structural body according to this embodiment may be used to manufacture a multilayer structural body with a thickness of 1 μm or more.

Next, details about determining conditions for forming the silicon nitride films exemplified above and results of experiments carried out on this occasion are described. The deposition rate of chemical vapor deposition including an HDP-CVD process can be increased by increasing the RF power or the flow rate of each of a monosilane ($SiH_4$) gas and an ammonia ($NH_3$) gas. However, the upper limit of the RF power depends on the capacity of a radio-frequency power supply connected to an apparatus and the flow rate of gas is determined from the evacuation rate of a vacuum facility connected to a vent of the apparatus and the pressure during deposition.

Monosilane ($SiH_4$) and ammonia ($NH_3$) form silicon nitride ($Si_3N_4$) in accordance with a chemical reaction represented by the following equation:

$$3SiH_4 + 4NH_3 \rightarrow Si_3N_4 + 12H_2 \qquad (1).$$

From Chemical Equation (1), the stoichiometric ratio of $SiH_4$ to $NH_3$ is 0.75. From this, it has been determined that the flow rate ratio of $SiH_4$ to $NH_3$ is 0.75.

Applying a bias power reduces the deposition rate because of a sputter-etching effect. Therefore, it has been planned that a film that is as thick as possible is deposited under a condition applying no bias power and only shaping by semicircular chamfering is performed under a condition applying a bias power. In particular, after conditions for forming a film by applying no bias power have been determined as shown in Example 1 in Table 2, experiments for investigating conditions for forming a film by applying a bias power have been carried out.

TABLE 2

| | $SiH_4$ (sccm) | $NH_3$ (sccm) | $SiH_4/NH_3$ (flow rate ratio) | Applied bias (W) | Number of particles with a size of 0.16 μm or more | deposition rate (nm/min) | Stress (MPa) | Refractive index |
|---|---|---|---|---|---|---|---|---|
| Example 1 | 60 | 80 | 0.75 | 0 | 26 | 73.1 | −382 | 2.02 |
| Comparative Example 1 | 33 | 44 | 0.75 | 100 | | Delaminated | | |
| Comparative Example 2 | 33 | 44 | 0.75 | 500 | | Delaminated | | |
| Comparative Example 3 | 33 | 44 | 0.75 | 1,000 | 431 | 47.9 | −733 | 1.81 |
| Comparative Example 4 | 33 | 44 | 0.75 | 2,000 | 212 | 41.1 | −425 | 1.80 |
| Comparative Example 5 | 33 | 44 | 0.75 | 2,400 | 63 | 38.9 | −305 | 1.80 |
| Example 2 | 23 | 29 | 0.79 | 2,400 | 36 | 25.1 | −231 | 2.02 |

In this embodiment, as requirements for processing the structural body, four requirements below have been set in addition to increasing the deposition rate.

Requirements for Processing Structural Body
(1) Adding an argon (Ar) gas and sharply shaping a semicircular portion by applying a bias power.
(2) Causing no delamination.
(3) Generating no particles.
(4) A refractive index of 1.90 to 2.20.

Experiments for determining deposition conditions meeting these requirements have been carried out. Silicon nitride films were formed in such a manner that the flow rate of each of $SiH_4$ and $NH_3$ and the applied bias power were diversely varied as shown in Table 2 for the purpose of varying the film quality. The silicon nitride films were evaluated for four items: particles, deposition rate, stress, and refractive index.

Deposition conditions not shown in Table 2 were as described below.

The RF power was 1,500 W, the flow rate of Ar was 10 sccm, the pressure was 5.0 Pa, and the treatment temperature was 170° C. As compared to Example 1, the RF power was reduced from 4,000 W to 1,500 W and the sum of the flow rates of source gases ($SiH_4$ and $NH_3$) was reduced from 140 sccm to 77 sccm. The reason for this was to reduce the deposition rate of a silicon nitride film to increase a sputter-etching effect by Ar ions. In every example, the deposition time was fixed to 200 seconds. For particles, in a silicon substrate with a size of a 300 mm, objects with a size of 0.16 μm or more were judged particles, that is, dust. In consideration of the propagation loss of a waveguide due to particles, evaluation was performed in such a manner that a standard not affecting the yield was set to 50 particles or less per wafer. For stress in Table 2, a negative sign represents compressive stress and a positive sign represents tensile stress. The refractive index was measured at a wavelength of 633 nm by ellipsometry using an optical measurement system.

The bias power was varied at five levels: 100 W, 500 W, 1,000 W, 2,000 W, and 2,400 W. These conditions were used in Comparative Examples 1 to 5. For each comparative example, the number of particles, the deposition rate, the stress, and the refractive index were evaluated. Since the limit of the bias power of a device used was 2,400 W, the maximum of the applied bias power was 2,400 W. As the bias power was increased, evaluation results of particles and the stress were improved. Therefore, the applied bias power was determined to be 2,400 W.

Figure 6:
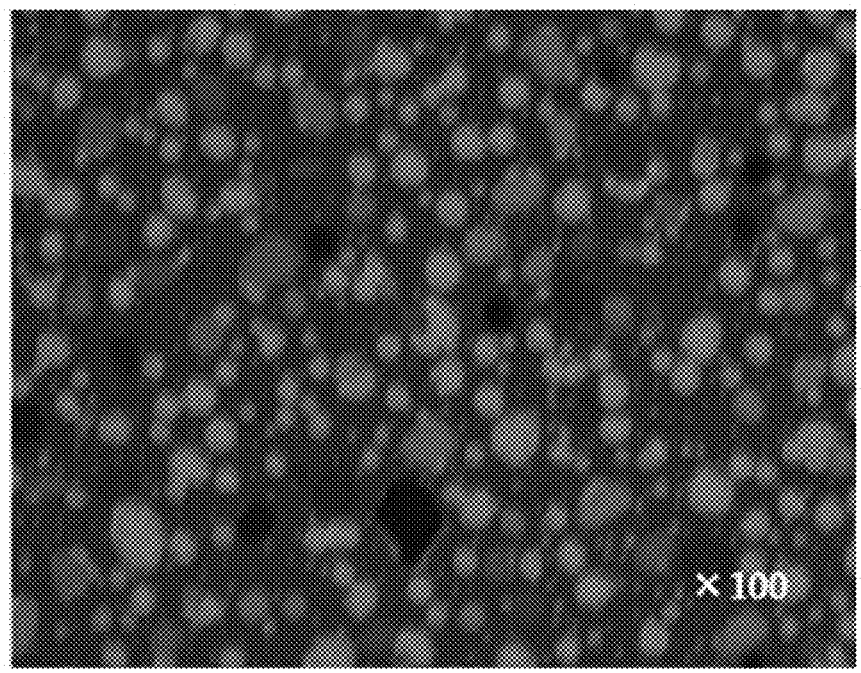
FIG. 6 is a micrograph of a silicon nitride film in a case of a bias power of 100 W (Comparative Example 1)
Figure 7:
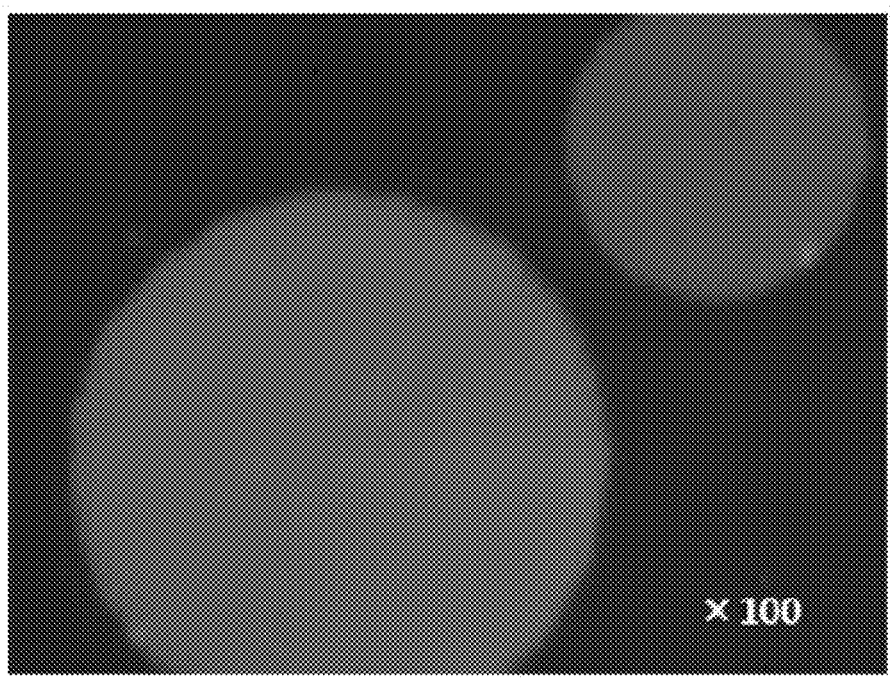
FIG. 7 is a micrograph of a silicon nitride film in a case of a bias power of 500 W (Comparative Example 2)

However, under deposition conditions in all of Comparative Examples 1 to 5, the refractive index was 1.80 to 1.81, which did not meet the processing requirements. Under two conditions including a bias power of 100 W and a bias power of 500 W, delamination occurred. FIG. 6 is a micrograph of a silicon nitride film in a case of a bias power of 100 W (Comparative Example 1). Micro-delaminations looking like particles occurred over a wafer. FIG. 7 is a micrograph of a silicon nitride film in a case of a bias power of 500 W (Comparative Example 2). In this case, delaminations larger than those in the case of a bias power of 100 W occurred over a wafer.

Figure 8:
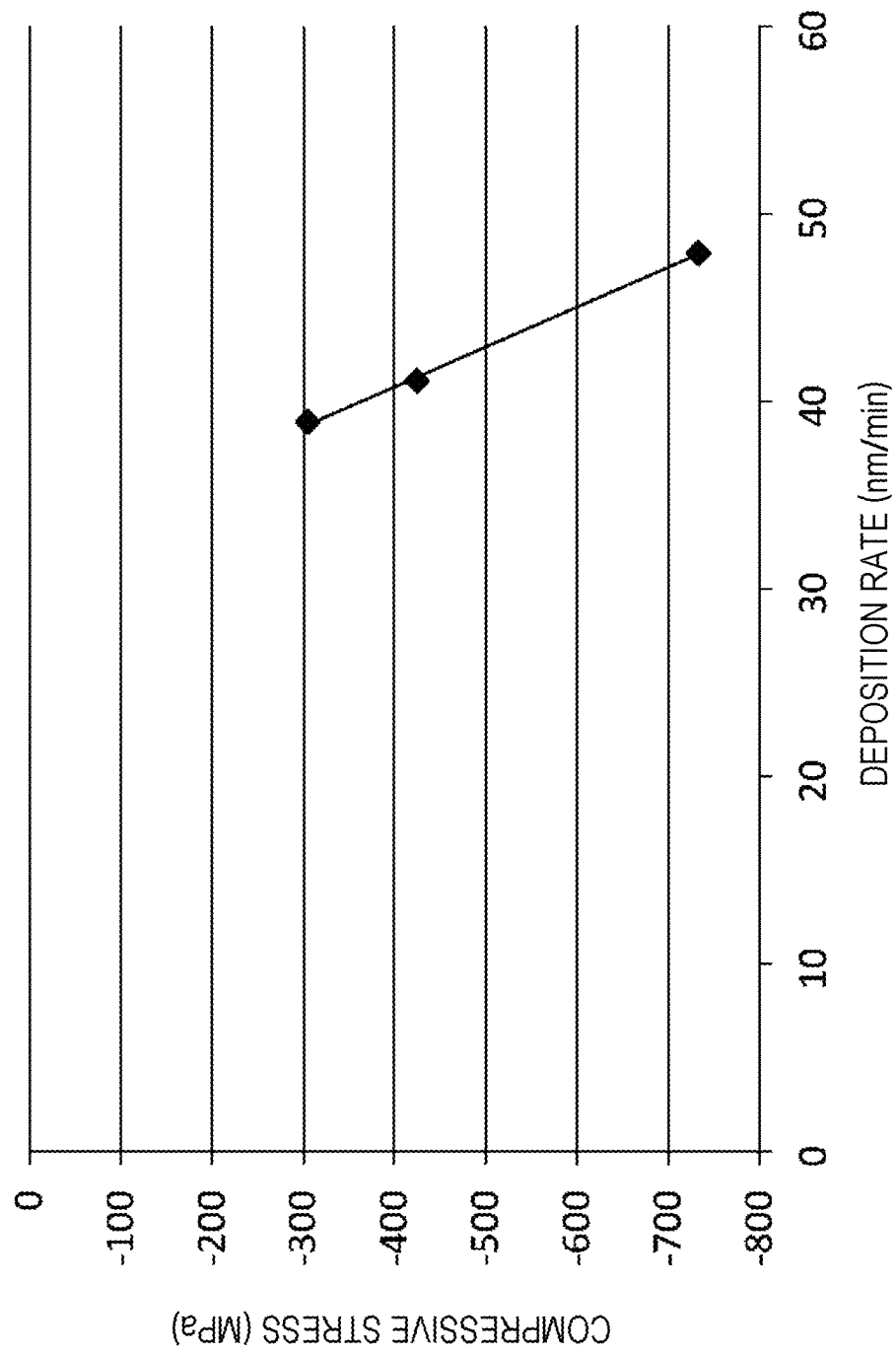
FIG. 8 is a graph showing the relationship between the deposition rate and the compressive stress as measured by varying the bias power under conditions of Comparative Examples 3 to 5.

FIG. 8 is a graph showing the relationship between the deposition rate and the compressive stress as measured by varying the bias power under conditions of Comparative Examples 3 to 5. It is clear that the compressive stress increases with the increase of the deposition rate. When the deposition rate is high, the number of ions colliding with a silicon nitride film during deposition is large and the heat energy generated by collision and the density of defects per unit volume are high. Therefore, it is inferred that volume expansion occurs to increase the compressive stress.

From results in FIG. 8, it was clear that increasing the deposition rate increased the compressive stress. Therefore, the sum of the flow rates of $SiH_4$ and $NH_3$ was further reduced. It was planned to form a silicon nitride film with a high refractive index by increasing the content of silicon in a silicon nitride film composed of atoms of silicon (Si) and nitrogen (N). In particular, the flow rate of a $SiH_4$ gas was increased and the flow rate ratio of $SiH_4$ to $NH_3$ was increased. Conditions of Comparative Example 5 were changed to conditions of Example 2 as shown in Table 2. The flow rate ratio of $SiH_4$ to $NH_3$ was increased from 0.75 to 0.79 by performing deposition under the conditions of Example 2. Increasing the flow rate ratio of $SiH_4$ to $NH_3$ allowed the refractive index to be 2.02, thereby enabling the condition of the refractive index in Requirement (4) above to be satisfied. Finally, conditions for forming a silicon nitride film by applying a bias power were determined to be the conditions of Example 2.

Next, results of an experiment performed to form silicon nitride films into a composite are described.

Figure 9:
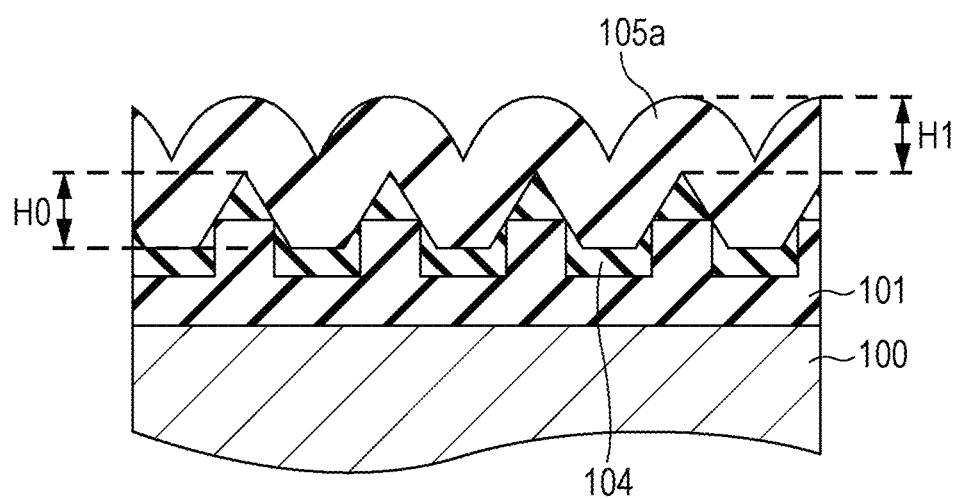
FIG. 9 is an illustration showing the height H0 of concave portions of and the depth H1 of convex portions that are indicators of the shape of a silicon nitride film.

A shape was optimized by introducing H0 and H1 as indicators of a processing shape as shown in FIG. 9. FIG. 9 is an illustration showing the height H0 of concave portions of and the depth H1 of convex portions that are indicators of the shape of a silicon nitride film 105a. H0 corresponds to the height of triangular portions of a silicon oxide film 104. H1 corresponds to the height of the silicon nitride film 105a. A target processing shape satisfies that H0=H1 in such a state that the silicon nitride film 105a has been formed and that the reduction of H0 is suppressed. First, whether a single film of the silicon nitride film 105a could be formed was experimentally verified. Thereafter, a silicon oxide film 106 was deposited under conditions shown in FIG. 2G, followed by the SEM observation of a cross section. In this operation, the silicon nitride film 105a was formed under deposition conditions of Example 1 shown in Table 2 so as to have a thickness of 350 nm.

Figure 10:
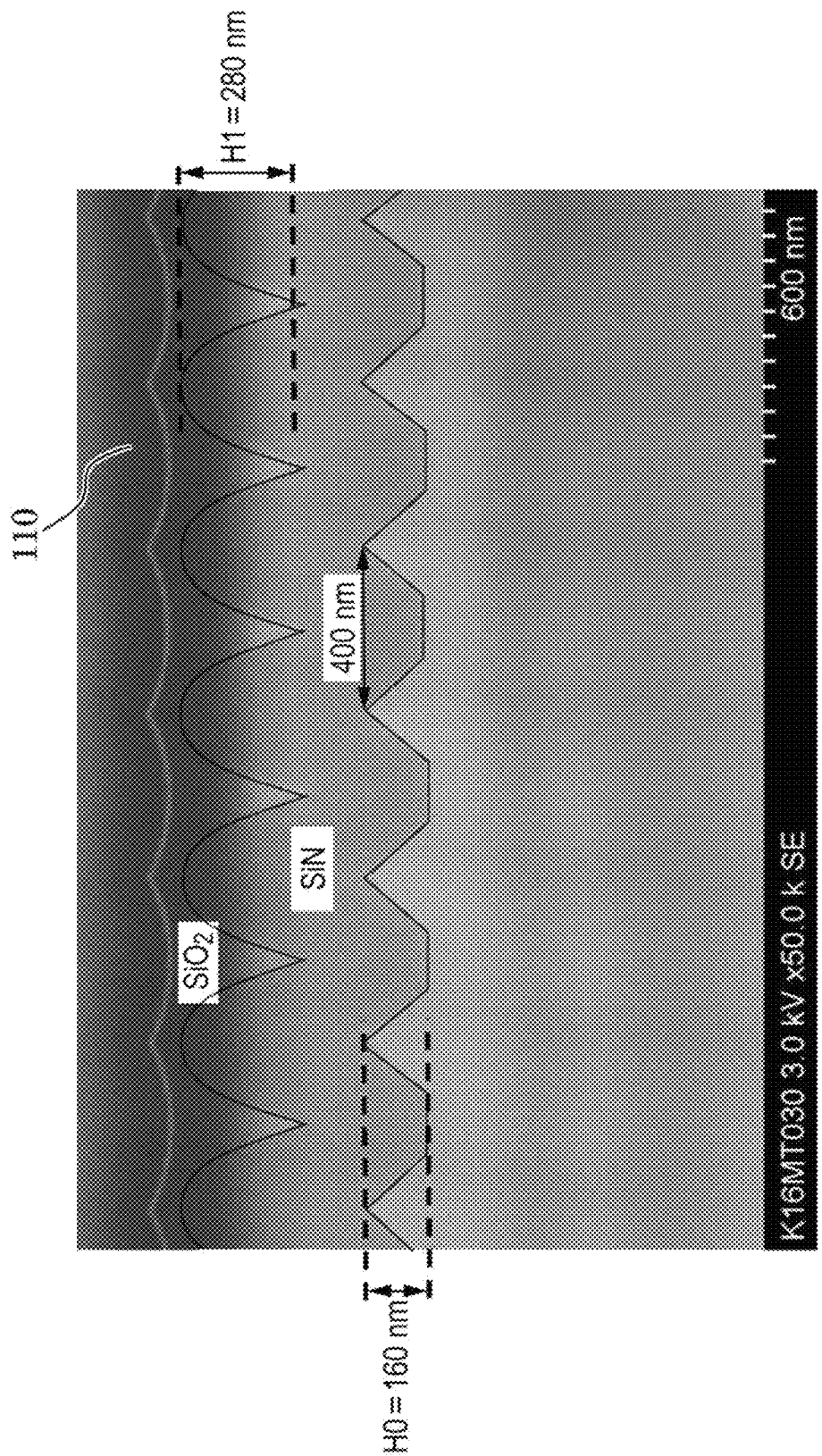
FIG. 10 is a SEM image showing a cross-sectional shape of a structural body in a comparative example.

FIG. 10 is a SEM image showing a cross-sectional shape of a structural body in this example. In this example, H0 is 160 nm and H1 is 280 nm. The shape of upper portions of the silicon nitride film 105a is semicircular. In FIG. 10 and FIGS. 11 to 14, the outline of the interfaces between a silicon nitride film and silicon oxide films located on both sides thereof is drawn with a dotted line for the purpose of facilitating visualization.

Next, a silicon nitride film 105a was formed under deposition conditions (a bias of 2,400 W applied) of Example 2 shown in Table 2 so as to have a thickness of 350 nm.

Figure 11:
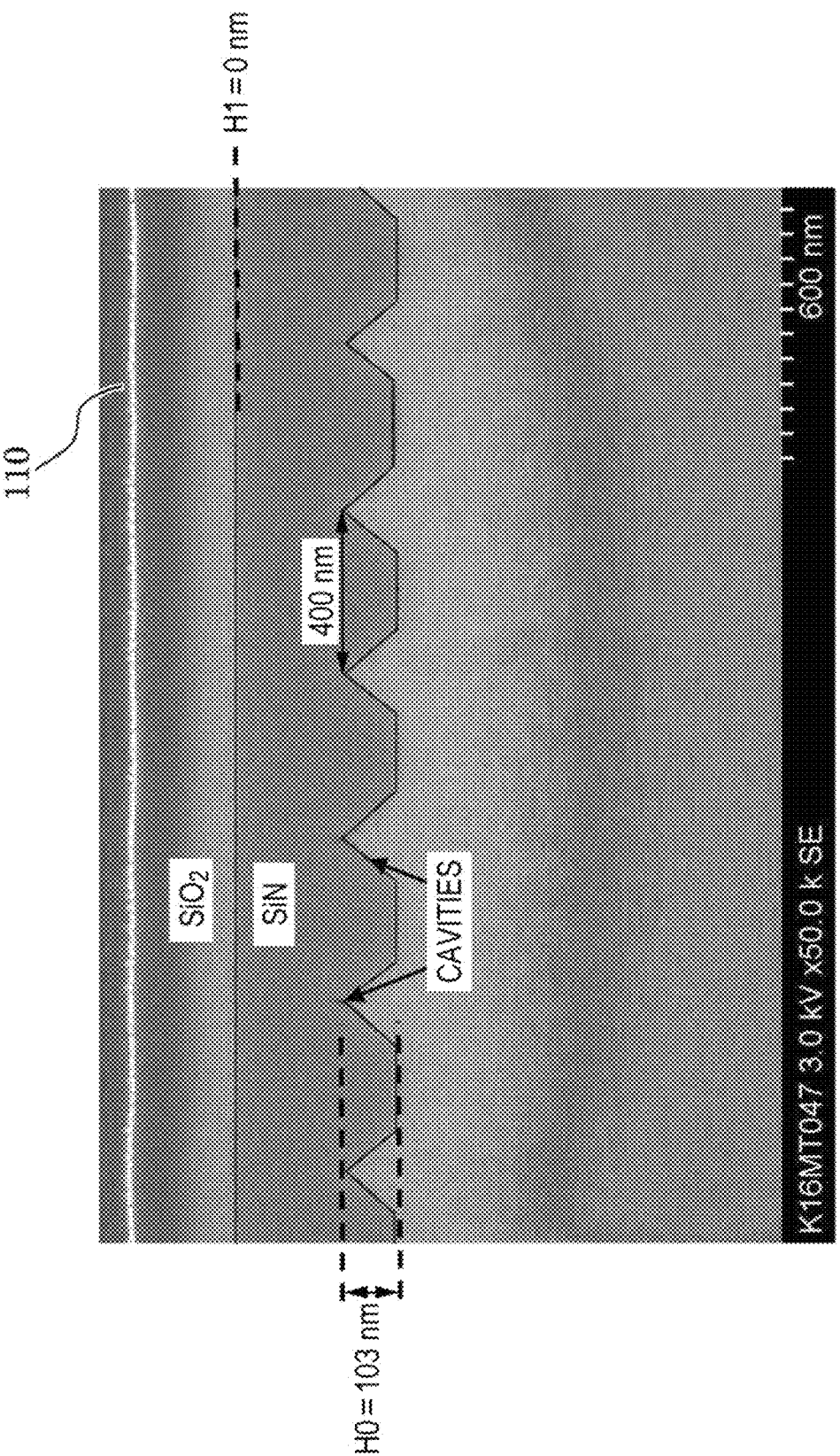
FIG. 11 is a SEM image showing a cross-sectional shape of a structural body in a comparative example.

FIG. 11 is a SEM image showing a cross-sectional shape of a structural body in this example. In this example, H0=103 nm, H1=0 nm, and the top surface of a silicon nitride film was flat. Cavities like voids were observed near triangular tops defining H0.

Furthermore, a silicon nitride film 105a was formed under deposition conditions (a bias of 1,000 W applied) of Comparative Example 3 shown in Table 2 so as to have a thickness of 350 nm.

Figure 12:
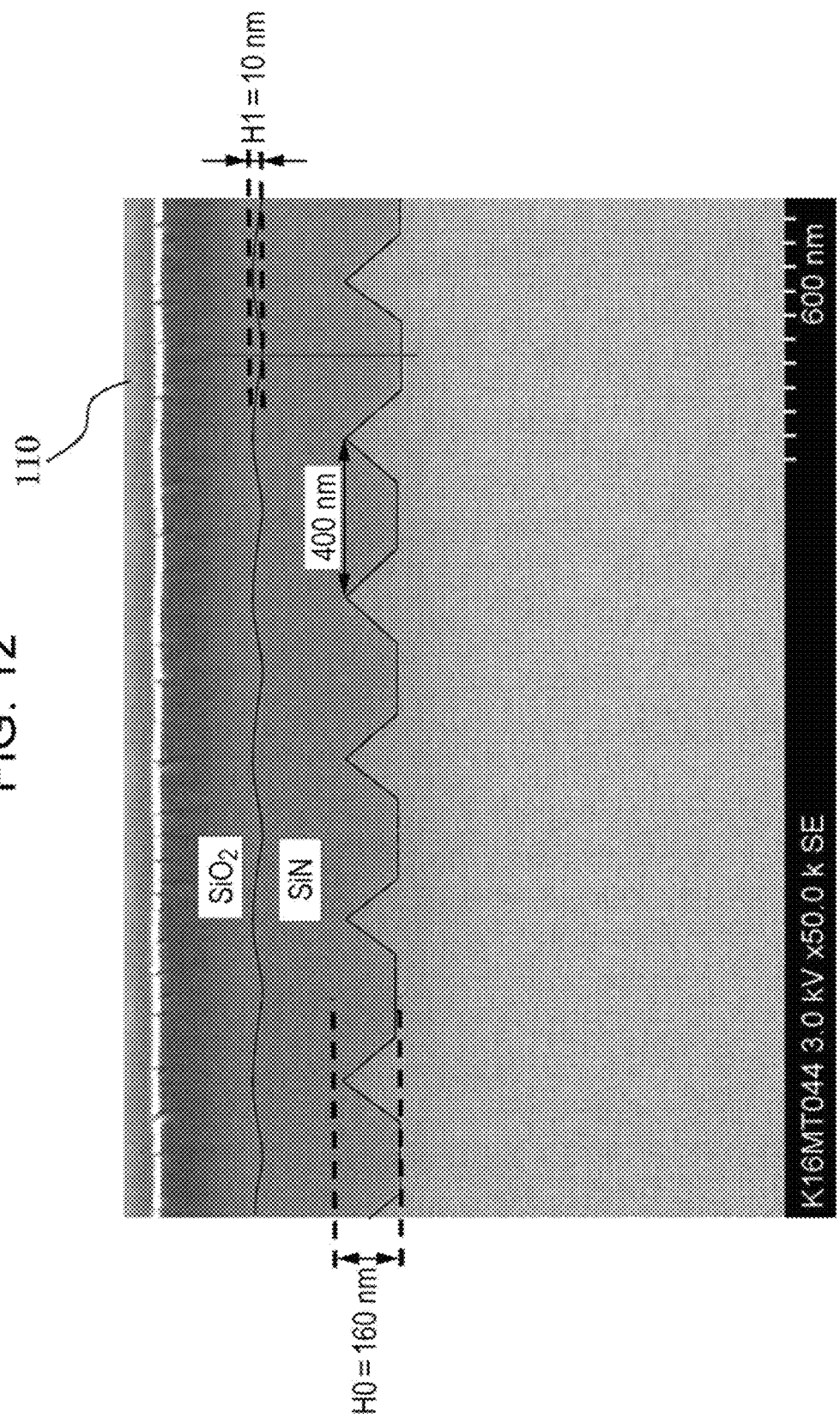
FIG. 12 is a SEM image showing a cross-sectional shape of a structural body in a comparative example.

FIG. 12 is a SEM image showing a cross-sectional shape of a structural body in this example. In this example, H1=10 nm, H0=160 nm, and triangular micro-protrusions (height H1) were observed on the top surface of a silicon nitride film.

Furthermore, a silicon nitride film 105a was formed under deposition conditions (a bias of 100 W or 500 W applied) of Comparative Example 1 or 2 shown in Table 2, resulting in the occurrence of delamination.

The above results revealed that it was difficult to form a periodic irregular shape (or a sawtooth shape) with a silicon nitride film alone by controlling the applied bias power. Therefore, a composite of silicon nitride films was formed. Experiments to form a composite of a film formed by applying no bias in Example 1 and a film formed by applying a bias of 2,400 W in Example 2 as shown in Table 2 were carried out.

Figure 13:
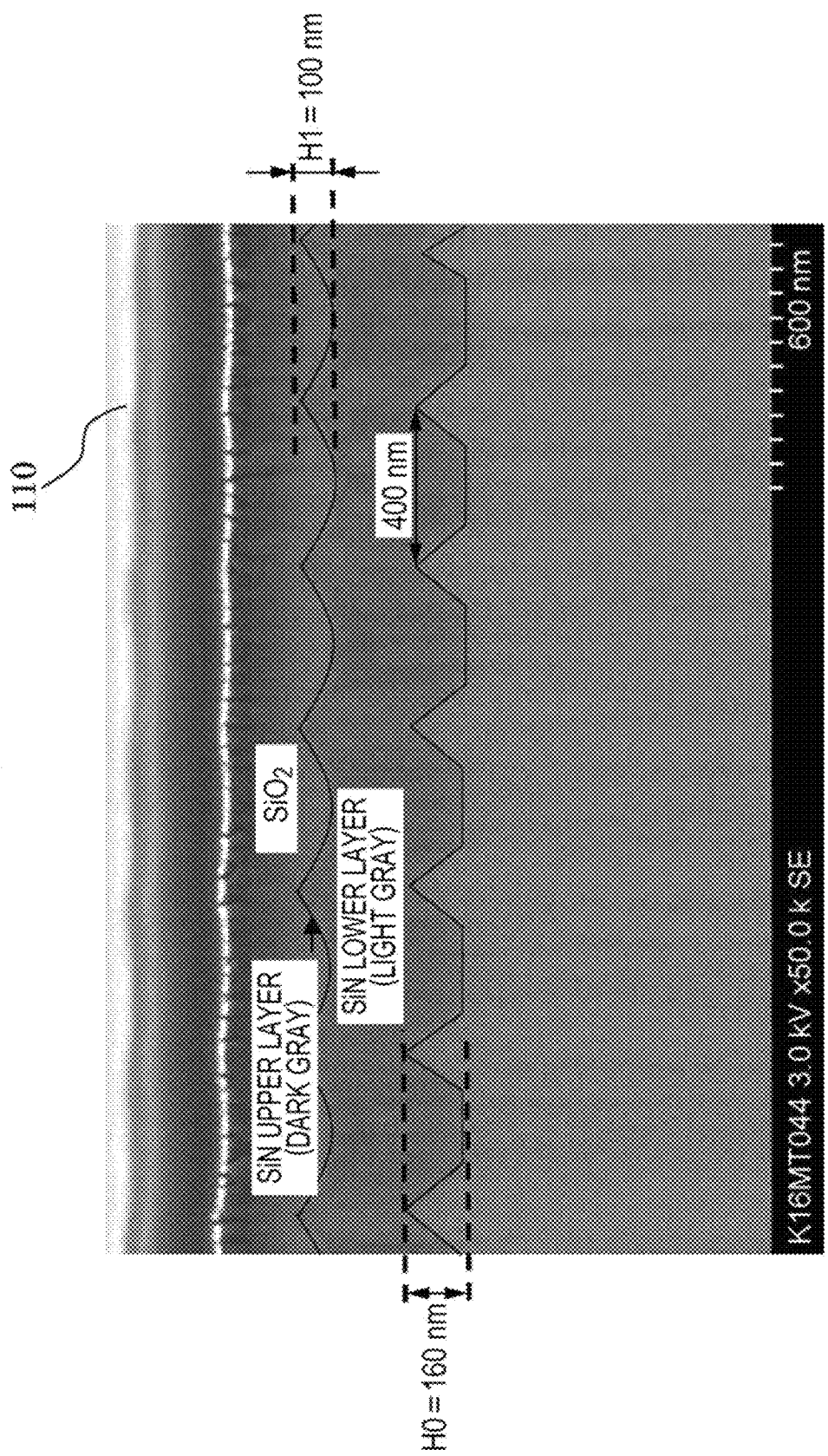
FIG. 13 is a SEM image showing a cross section of a structural body including a composite of silicon nitride films.

FIG. 13 is a SEM image showing a cross section of a structural body including a composite of silicon nitride films. In this example, a silicon nitride film formed by applying no bias has a thickness of 250 nm and a silicon nitride film formed by applying a bias of 2,400 W has a thickness of 100 nm. That is, H0=160 nm, H1=100 nm, and H0>H1. Therefore, the thickness ratio of a silicon nitride film formed by applying no bias and a silicon nitride film formed by applying a bias was re-investigated.

Figure 14:
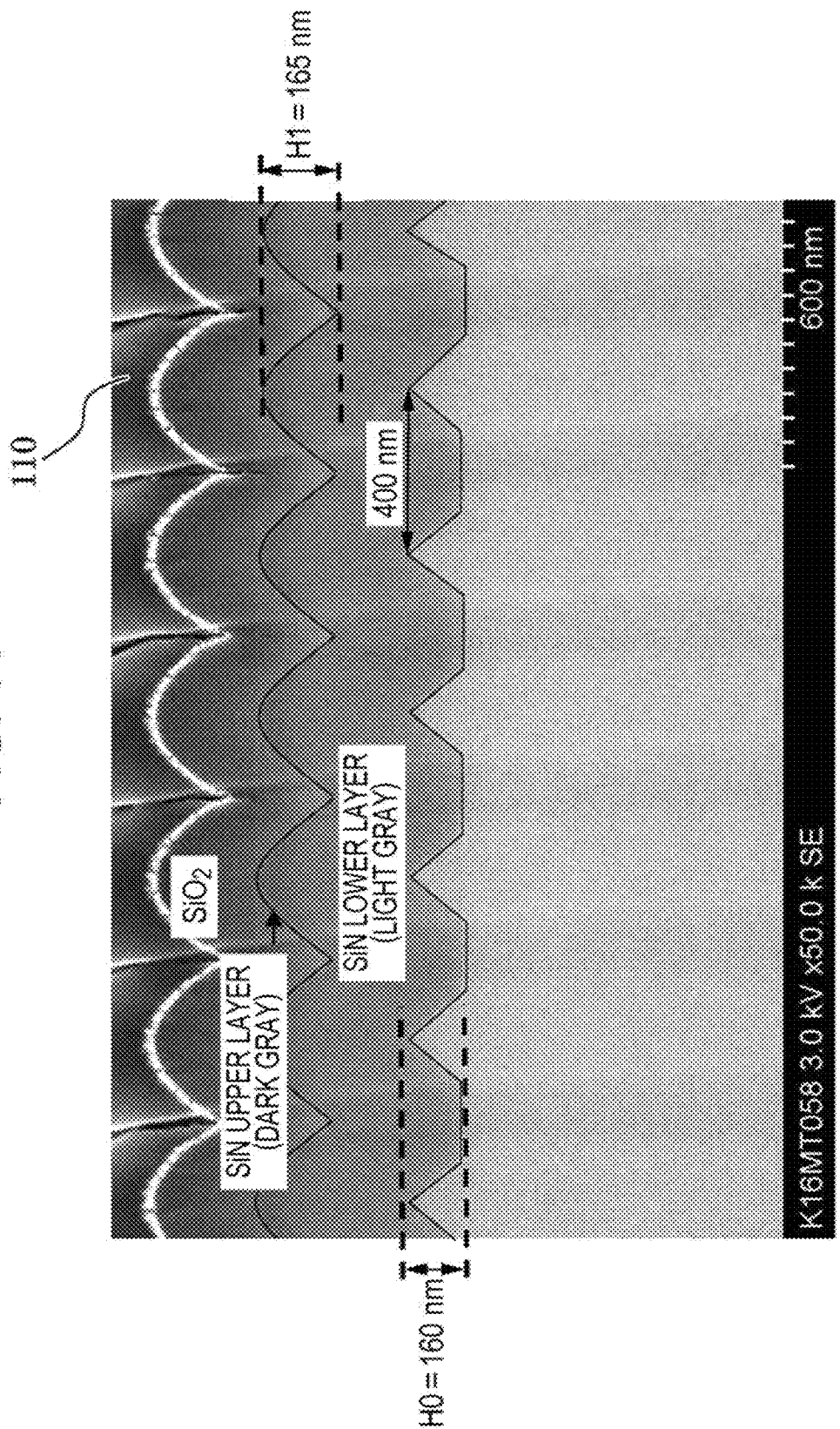
FIG. 14 is a SEM image showing a cross section of a structural body including a composite of silicon nitride films after re-investigation.

FIG. 14 is a SEM image showing a cross section of a structural body including a composite of silicon nitride films after re-investigation. In this example, a silicon nitride film formed by applying no bias has a thickness of 310 nm and a silicon nitride film formed by applying a bias of 2,400 W has a thickness of 40 nm. This means that H0=160 nm, H1=165 nm, and H0≈H1. Therefore, processing was performed using the thickness ratio of this composite.

As is clear from the above experiments, the height H1 can be substantially matched to H0 in such a manner that after a silicon nitride film is formed under conditions as used in Example 1 by applying no bias power so as to be thicker than the height H0 of a triangular cross section of a silicon oxide film 104, a silicon nitride film is formed under conditions as used in Example 2 by applying a bias power. In this case, the thickness of the silicon nitride film formed by applying no bias power is larger than the thickness of the silicon nitride film formed by applying a bias power.

Figure 15:
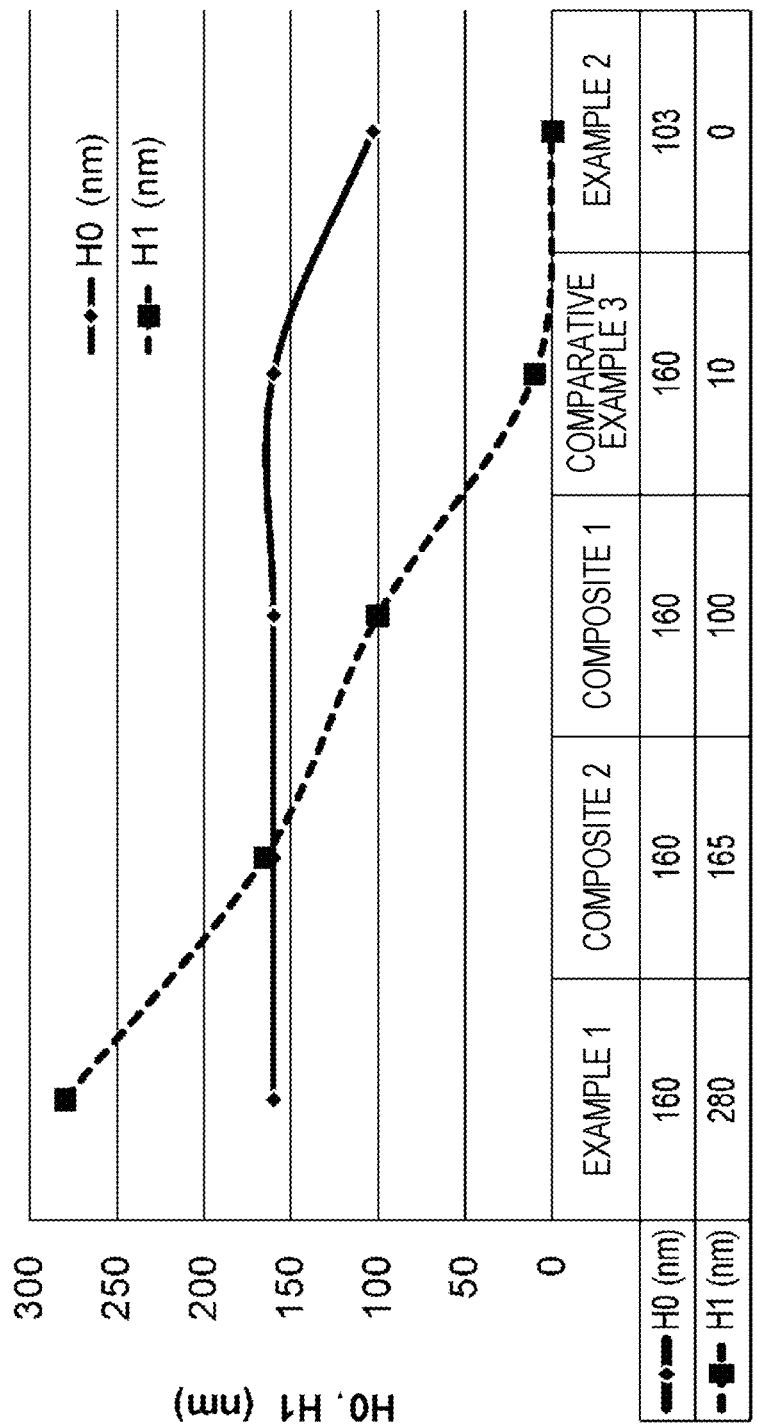
FIG. 15 is a graph showing the relationship between H0 and H1 of samples used in experiments.

FIG. 15 is a graph showing the relationship between H0 and H1 of samples used in the above experiments. In Example 1, in which no bias was applied, H0<H1. In Example 2 and Comparative Example 3, in which a bias was applied, H0>H1. These results reveal that it is difficult to meet the condition H0=H1 by the formation of a single film. In a case where a composite of silicon nitride films is formed, the ratio of the thickness of a film formed by applying no bias to the thickness of a film formed by applying a bias is important. It is important to determine deposition conditions such that H0=H1 like a composite 2 shown in FIG. 15.

Next, advantages of the method for manufacturing the structural body according to this embodiment are described in comparison with a conventional bias sputtering process.

The deposition rate by the HDP-CVD process in this embodiment can be increased above that by the conventional bias sputtering process. The deposition rate of a silicon oxide film that is a low-refractive index film is 75 nm/min. When the thickness of the silicon oxide film is 220 nm, the deposition time per period is 176 seconds. The deposition rate of a silicon nitride film formed by applying no bias power is 73.1 nm/min. When the thickness of this silicon nitride film is 270 nm, the deposition time per period is 211 seconds. The deposition rate of a silicon nitride film formed by applying a bias power is 25.1 nm/min. When the thickness of this silicon nitride film is 80 nm, the deposition time per period is 191 seconds. Accordingly, the deposition time for one period of a composite of a silicon oxide film having a thickness of 220 nm and a silicon nitride film having a thickness of 350 nm is 588 seconds. Thus, in this embodiment, a structural body with four periods can be manufactured in 39 minutes (2,352 seconds).

However, in a conventional bias sputtering process disclosed in Japanese Unexamined Patent Application Publication No. 2003-255162, the deposition rate of a high-refractive index film is 16.8 nm/min and the deposition rate of a low-refractive index film is 3.1 nm/min. Supposing that the thickness of a period of low-refractive index films is 220 nm and the thickness of the low-refractive index film is 350 nm, it takes 71 minutes to form the low-refractive index films and it takes 21 minutes to form the high-refractive index film. In this case, the deposition time for one period is 92 minutes and that for four periods is 368 minutes. The conventional bias sputtering process requires an about ten times longer treatment time as compared to the HDP-CVD process in this embodiment. As described above, the manufacturing method according to this embodiment can increase productivity and can reduce manufacturing costs as compared to the conventional bias sputtering process.

In the conventional bias sputtering process, a substrate is exposed to plasma for a long time during deposition. Therefore, the temperature of the substrate is increased, which is not suitable for treating an organic material such as a resin material. In this embodiment, using the HDP-CVD process enables the deposition rate to be increased and allows the deposition temperature to be low, 200° C. or lower. Therefore, the structural body can be manufactured using an organic material such as a resin material. According to this embodiment, the deposition rate can be increased and a high-quality optical thin film which has a uniform refractive index, which is free of delamination, and which has few particles can be formed.

In this embodiment, materials, sizes, and deposition conditions of layers of the structural body are for exemplification only. These conditions can be appropriately changed depending on performance required for a finally manufactured device.

Second Embodiment

An imaging device according to a second embodiment of the present disclosure is described below. The imaging device includes a structural body according to an embodiment of the present disclosure and a solid-state imaging element.

A device obtained by integrating the solid-state imaging element with the structural body provides a light detection technique capable of measuring the degree of coherence of light passing through or reflected by an object without a complicated operation. The design and operating principle of the light detection technique are disclosed in, for example, U.S. Patent Application Publication Nos. 2016/360967 and 2017/023410.

The solid-state imaging element may be, for example, a charge-coupled device (CCD) or a complementary metal oxide semiconductor (CMOS) sensor. The structural body can be attached to both the CCD and the CMOS sensor. At present, CMOS sensors are in the mainstream of solid-state imaging elements because of the advantages of power consumption and high-speed read-out. Therefore, an example of integrating the CMOS sensor with the structural body is described below.

Figure 16:
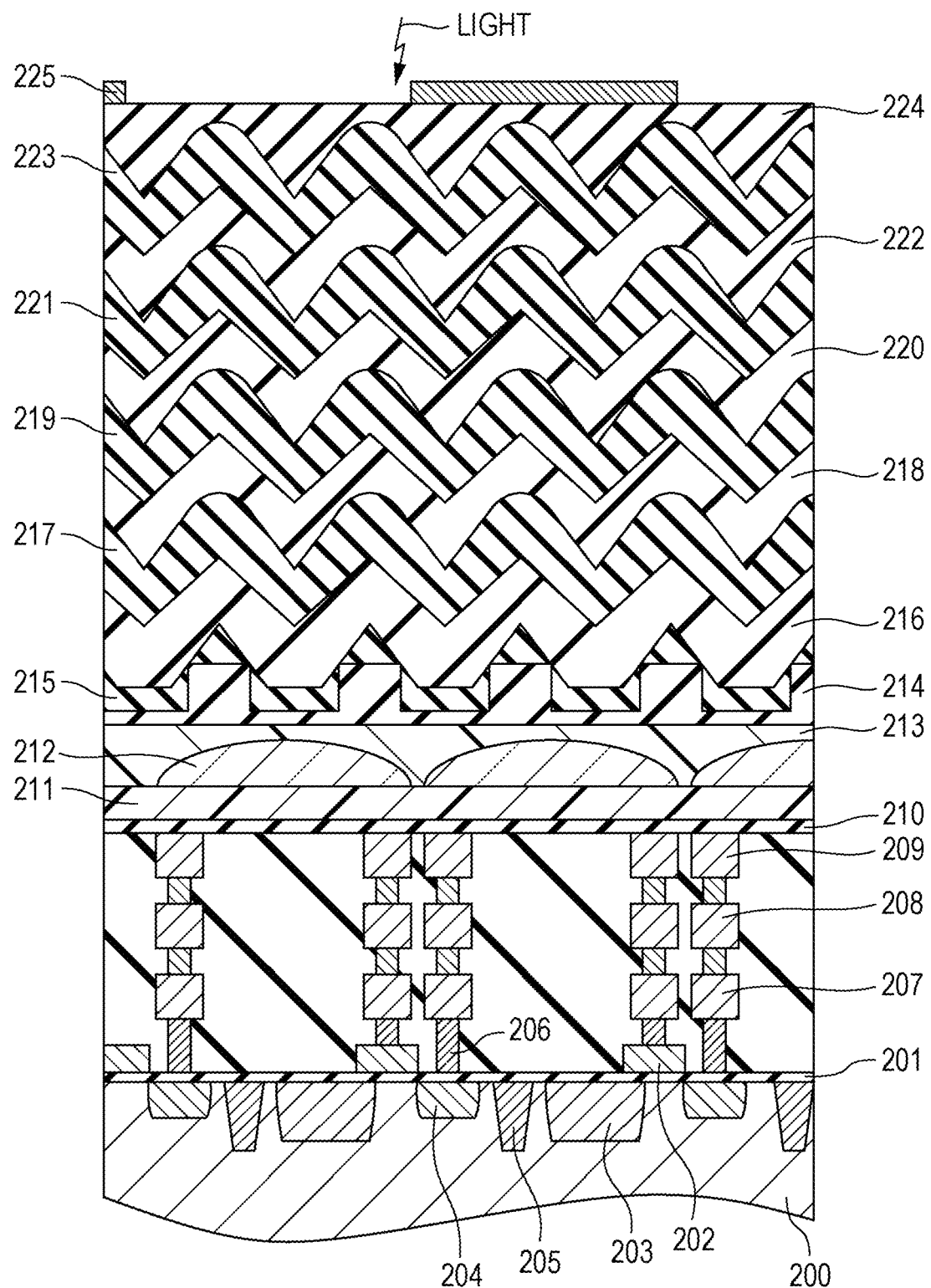
FIG. 16 is a schematic sectional view showing the structure of a portion of an imaging device according to a second embodiment of the present disclosure.

FIG. 16 is a schematic sectional view showing the structure of a portion of the imaging device. As shown in FIG. 16, a gate insulating film 201 that is a silicon oxide film and gate electrodes 202 made of polysilicon are placed on a silicon substrate 200 in that order.

Light-receiving sections 203 including a photodiode and detection sections 204 are composed in the form of N-type impurity regions formed in the silicon substrate 200 by ion implantation or the like. The light-receiving sections 203 extend from a surface of the silicon substrate 200 to a depth of about 0.2 µm to 2.0 µm. A buried structure, which is not shown, provided with a surface P-type layer is used to suppress the dark current. An element isolation region 205 is placed between two of the neighboring light-receiving sections 203. Element isolation by the element isolation region 205 is called shallow trench isolation (STI). An implant isolation technique may be used instead of STI.

The impurity concentration of the detection sections 204 may be such that ohmic connections can be made using metal wiring lines. The impurity concentration of the detection sections 204 may be, for example, $1.0 \times 10^{15}$ cm$^{-2}$ or more. The detection sections 204 extend from a surface of the silicon substrate 200 to a depth of about 0.1 µm to 0.5 µm. After being transferred to the detection sections 204, the charge detected by the light-receiving sections 203 is detected by the gate electrodes 202 as an output signal through a first wiring layer 207, a second wiring layer 208, and a third wiring layer 209.

A silicon oxide film that is a well-known insulating film is deposited on the gate insulating film 201 and is planarized by chemical mechanical polishing (CMP) that is a well-known technique. A film formed in a region extending from the gate insulating film 201 to the first wiring layer 207 is called a pre-metal dielectric (PMD). Contact sections 206 are formed on the detection sections 204, the gate electrodes 202, source/drain regions used in transistors in a peripheral circuit (not shown), and gate electrodes through the PMD. The contact sections 206 are formed using, for example, a tungsten (W) material.

Furthermore, a first interlayer insulating film is formed using material such as silicon oxide. The first wiring layer 207 is formed by, for example, a single damascene process so as to include first copper wiring lines. In order to prevent the oxidation of the first copper wiring lines, an anti-diffusion film (not shown) made of silicon nitride may be deposited. The anti-diffusion film on the light-receiving sections 203 is selectively removed and a silicon nitride film is selectively removed.

Likewise, a second interlayer insulating film is deposited using material such as silicon oxide and is then planarized by CMP. The second wiring layer 208 and an anti-diffusion film (not shown) are formed by a process such as a dual damascene process due to a via-first process. The second wiring layer 208 includes second copper wiring lines. The anti-diffusion film on the light-receiving sections 203 is selectively removed.

Next, after a third interlayer insulating film is deposited similarly to the second interlayer insulating film, the third wiring layer 209 is formed so as to include third copper wiring lines. Furthermore, a protective film 210 serving as a passivation film is formed. The protective film 210 is formed from, for example, a silicon nitride film. The protective film 210 on the light-receiving sections 203 may be selectively removed.

An example of using three levels of copper wiring lines as wiring lines has been described herein. Aluminium wiring lines may be used instead.

Next, the protective film 210 is perforated to the third wiring layer 209 by lithography and dry etching and a contact layer (for example, a multilayer film of titanium and titanium nitride) and a layer of aluminium or the like are formed with a sputtering system. Thereafter, a bonding pad section and an optical black (OB) section (not shown) are formed by lithography and dry etching at the same time.

A planarizing layer 211 is formed on the protective film 210. The planarizing layer 211 is placed for the purpose of eliminating a difference in level between the bonding pad section and the OB section. The planarizing layer 211 is made of material that can be applied by, for example, a spin coating process. The planarizing layer 211 can be formed using, for example, an organic resin material, particularly a transparent thermosetting resin material such as an acrylic resin material, a styrenic resin material, or an epoxy resin material. In this embodiment, as an example, an acrylic resin (a refractive index of 1.49 to 1.50) is used and is thermally cured at 200° C. for several minutes. This enables microlenses 212 and the structural body to be aligned in parallel to arrays of the light-receiving sections 203. As a result, light can be efficiently collected by the light-receiving sections 203 without being scattered, thereby increasing the sensitivity.

Arrays of the microlenses 212 are formed on the planarizing layer 211. The microlenses 212 can be formed using, for example, a positive photosensitive resist containing a photosensitive group derived from naphthoquinonediazide. The positive photosensitive resist has a refractive index of 1.50 to 1.70. The microlenses 212 are formed by melting resin with a heat flow such that light is efficiently collected by the light-receiving sections 203 and the microlenses 212 have a semi-elliptical shape. The microlenses 212 may be formed in such a manner that an inorganic material such as silicon nitride or silicon oxynitride ($SiO_xN_y$) is deposited, followed by resist etch-back.

A planarizing layer 213 is formed on the microlenses 212. The purpose of the planarizing layer 213 is to eliminate differences in level caused by the microlenses 212. The planarizing layer 213 may be made of material that can be applied by, for example, a spin coating process. The planarizing layer 213 can be formed using, for example, an organic resin material, particularly a transparent thermosetting resin material such as an acrylic resin material, a styrenic resin material, or an epoxy resin material. In this embodiment, as an example, an acrylic resin (a refractive index of 1.49 to 1.50) is used and is thermally cured at 200° C. for several minutes, followed by planarization. This enables the microlenses 212 and the structural body to be aligned in parallel to the arrays of the light-receiving sections 203. A portion of light passing through or reflected by a light source can be guided in the structural body in the form of guided light. Guided light can propagate in a waveguide layer in the structural body without being scattered by irregularities.

Next, an example of a method for forming the structural body is described.

The structural body can be prepared under substantially the same conditions as the deposition conditions described in the first embodiment. A source gas used may be a gas mixture of monosilane ($SiH_4$) and oxygen ($O_2$). A silicon oxide film 214 for forming lines and spaces is formed on the planarizing layer 213. The silicon oxide film 214 has a thickness of, for example, about 400 nm. The silicon oxide film 214 is formed by lithography and a dry etching process as described with reference to FIGS. 2B and 2C. Next, a silicon oxide film 215 is formed by the method described with reference to FIG. 2D. Furthermore, a silicon nitride film 216 and silicon oxide film 217 in the first period are formed by the method described with reference to FIGS. 2E to 2G. Likewise, silicon nitride films 218, 220, and 222 and silicon oxide films 219, 221, and 223 in the second to fourth periods are formed by the method described with reference to FIGS. 2H to 2L.

After the structural body is formed as described above, a silicon oxide film 224 is deposited and is planarized by chemical mechanical polishing (CMP). An example of conditions for forming the silicon oxide film 224 is as described below. A raw material used is a gas mixture of monosilane ($SiH_4$) and oxygen ($O_2$). The flow rate of a $SiH_4$ gas may be set to 50 sccm, the flow rate of an $O_2$ gas may be set to 100 sccm, the pressure may be set to 7.0 Pa, the RF power may be set to 3,000 W, the bias power may be set to 0 W, and the treatment temperature may be set to 170° C. The silicon oxide film 224 can be formed under these conditions. The silicon oxide film 224 is treated with no bias for the purpose of maintaining a periodic irregular shape. Incidentally, the silicon oxide film 223 may be omitted and the silicon oxide film 224 may be deposited on the silicon nitride film 222.

A light-shielding film 225 including a contact layer is formed on the planarized silicon oxide film 224. The light-shielding film 225 can be formed using an opaque material such as metal. The light-shielding film 225 can be formed using, for example, copper (Cu), aluminium (Al), titanium nitride (TiN), titanium (Ti), tungsten (W), tungsten nitride (WN), molybdenum (Mo), tantalum (Ta), platinum (Pt), an alloy thereof, or a silicide (transition metal silicide) thereof. In a case where a metal material is used, the light-shielding film 225 can be formed by a well-known technique using sputtering or vapor deposition, photolithography, etching, and a metal mask. The contact layer may be a multilayer film of titanium (Ti) or titanium nitride (TiN). An opaque material made of metal such as aluminium may be deposited on the contact layer. This enhances the adhesion of the light-shielding film 225 to the silicon oxide film 224 as compared to blocking light with a single aluminium film and enables the delamination of aluminium to be reduced.

A light-shielding pattern due to the light-shielding film 225 is a checker pattern or a stripe pattern in plan view from above in FIG. 16. Owing to the light-shielding film 225 formed on the structural body, a portion of light passing through or reflected by a light source can be separated with a grating and waveguide in the structural body and can be detected with each light-receiving section 203. Various types of information such as the degree of coherence of incident light can be gained by arithmetic processing using a signal output from the light-receiving section 203. For example, an image showing the spatial distribution of the degree of coherence of incident light can be produced. Such arithmetic processing can be executed by a signal-processing circuit connected to the imaging device according to this embodiment. Arithmetic processing is disclosed in, for example, U.S. Patent Application Publication Nos. 2016/360967 and 2017/023410 described above. The arithmetic processing disclosed in these documents can be similarly used in this embodiment.

A silicon oxide film or a band-pass filter may be formed on the light-shielding film 225 as required.

The solid-state imaging element and the structural body can be integrated by the above method. According to this embodiment, the following step can be eliminated: a step of preparing a mark for alignment on each of the solid-state imaging element side and the structural body side and performing alignment with a high precision of about several tens of nanometers with reference to either mark. Furthermore, there are no concerns about the occurrence of dust including particles during lamination, leading to an increase in yield.

The microlenses 212 and the planarizing layers 211 and 213 are often formed using an organic material such as resin. In this case, forming a film by high-temperature treatment at, for example, 200° C. or higher using the HDP-CVD process may possibly melt the organic material to cause a significant problem with light collection. Therefore, in order to prevent the thermal deterioration of the organic material, the distance H between the lower surface of the RF antenna 5 shown in FIG. 1 and the upper surface of the substrate 7 may be set to, for example, 150 mm to 250 mm. This allows the substrate 7 to be placed in a region with a low electron temperature even though the plasma 6 has high density. Therefore, the increase in temperature of the substrate 7 can be prevented. According to this configuration, treatment at, for example, 200° C. or lower is possible. Therefore, a dielectric film can be deposited on the microlenses 212 and the planarizing layers 211 and 213 by the HDP-CVD process.

Third Embodiment

An imaging device according to a third embodiment of the present disclosure is described below. The imaging device includes a multilayer solid-state imaging element including a wiring line and a photoelectric conversion film placed thereon and a structural body according to an embodiment of the present disclosure.

In the imaging device, the multilayer solid-state imaging element is used instead of a buried solid-state imaging element that includes light-receiving sections including a photodiode inside a silicon substrate as described in the second embodiment. The multilayer solid-state imaging element is an image sensor including a silicon substrate, a signal-processing circuit formed in the silicon substrate, and a photoelectric conversion section formed above the silicon substrate with a wiring layer therebetween.

Figure 17:
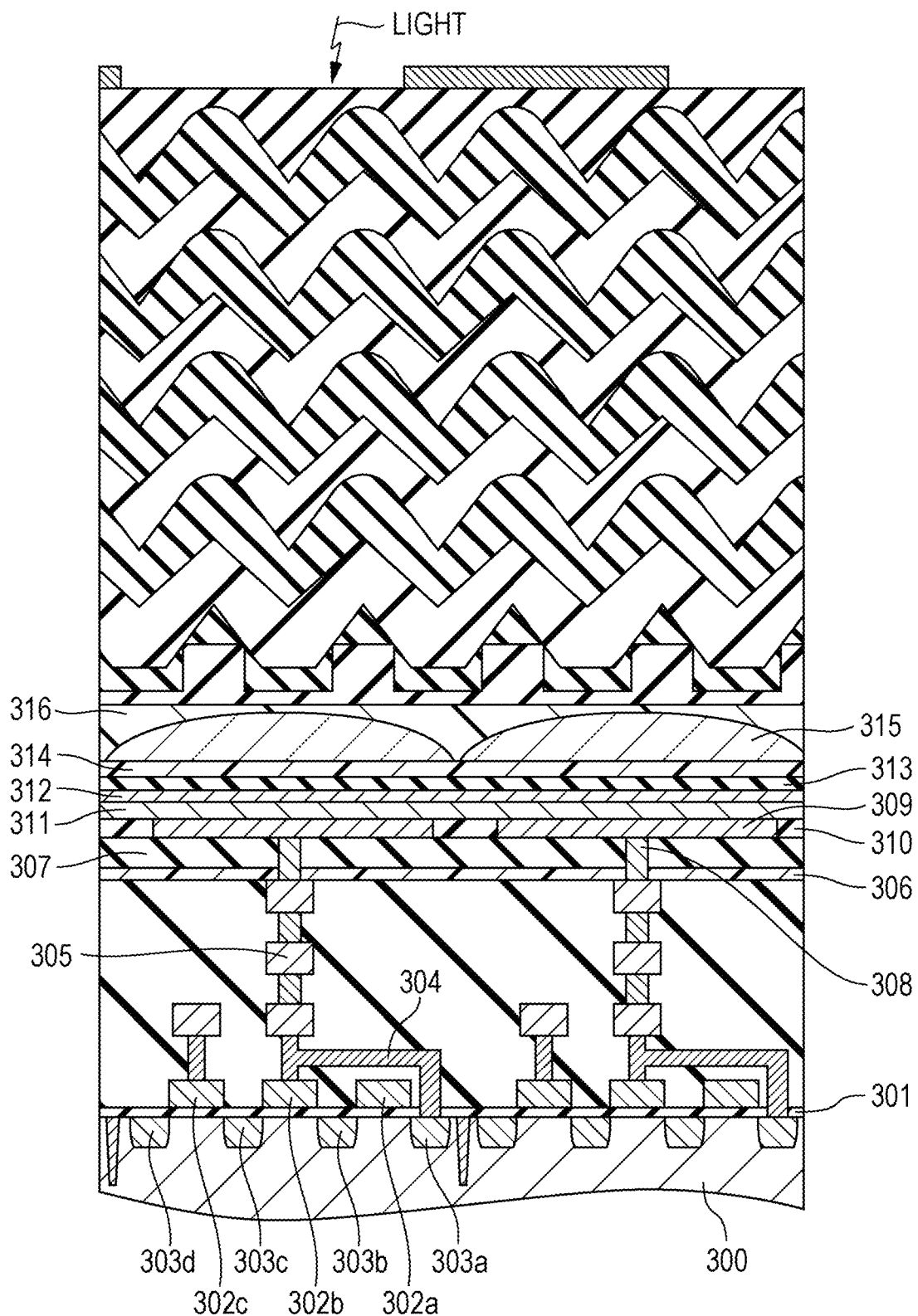
FIG. 17 is a schematic sectional view showing the structure of a portion of an effective pixel region of a multilayer solid-state imaging element according to a third embodiment of the present disclosure.

FIG. 17 is a schematic sectional view showing the structure of a portion of an effective pixel region of the multilayer solid-state imaging element. As shown in FIG. 17, a gate insulating film 301 that is a silicon oxide film and gate electrodes 302a, 302b, and 302c made of polysilicon are placed on a silicon substrate 300 in that order.

Figure 18:
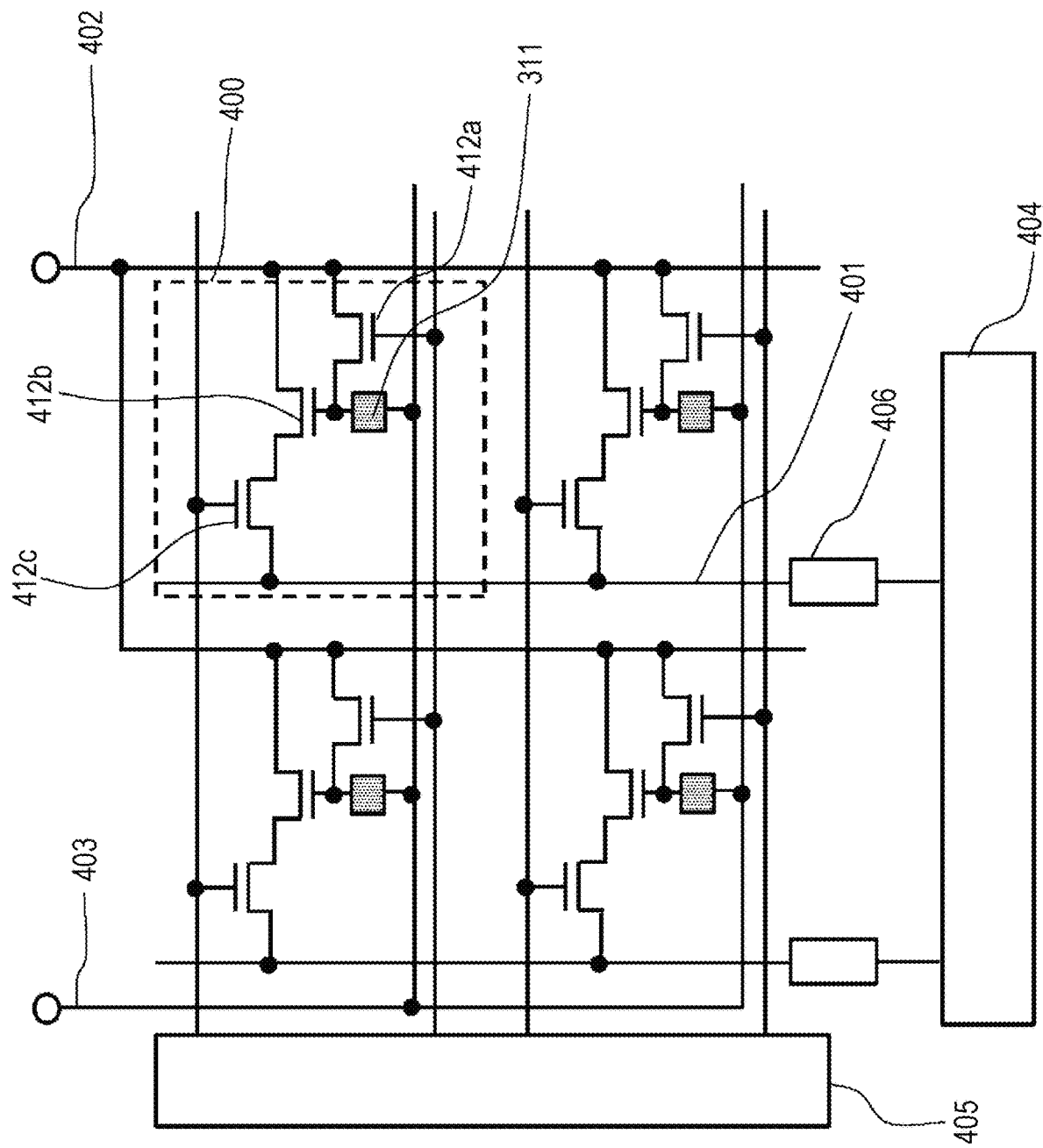
FIG. 18 is a diagram illustrating three transistors each of which includes a gate electrode and the flow of a signal charge.

The multilayer solid-state imaging element is outlined with reference to FIG. 18. FIG. 18 is a diagram illustrating three transistors each of which includes a corresponding one of the gate electrodes 302a, 302b, and 302c and the flow of a signal charge. The multilayer solid-state imaging element includes a plurality of two-dimensionally arranged unit pixel cells 400, a vertical signal line 401, a power supply line 402, a photoelectric conversion film control line 403, a horizontal signal read-out circuit 404, a vertical scanning circuit 405, and a plurality of column signal-processing circuit 406. Each unit pixel cell 400 includes a reset transistor 412a, an amplification transistor 412b, and an address transistor 412c. The reset transistor 412a includes the gate electrode 302a. The amplification transistor 412b includes the gate electrode 302b. The address transistor 412c includes the gate electrode 302c.

As shown in FIG. 17, photoelectric conversion films 311 are placed above wiring lines 305. When being irradiated with light, the photoelectric conversion films 311 generate and store a signal charge. The amplification transistor 412b outputs a signal voltage corresponding to the amount of the signal charge generated by the photoelectric conversion films 311. The reset transistor 412a resets, that is, initializes the signal charge stored in the photoelectric conversion films 311, in other words, the gate voltage of the amplification transistor 412b. The address transistor 412c can selectively output the signal voltage of the unit pixel cell 400 to the vertical signal line 401. The signal voltage is transmitted to the column signal-processing circuit 406. The column signal-processing circuit 406 is located between the vertical signal line 401 and the horizontal signal read-out circuit 404. The column signal-processing circuit 406 removes noise from the signal voltage. The horizontal signal read-out circuit 404 sequentially reads out signals to a horizontal common signal line, thereby enabling an image to be output.

The photoelectric conversion film control line 403 is commonly connected to the unit pixel cells 400 and applies the same voltage to the photoelectric conversion films 311.

The vertical scanning circuit 405 scans rows of the unit pixel cells 400 in a perpendicular direction and selects a row of the unit pixel cells 400 that output a signal voltage to the vertical signal line 401.

The power supply line 402 is connected to the drains of the amplification transistor 412b and the reset transistor 412a. In a region where the unit pixel cells 400 are arrayed, the power supply line 402 is wired in a perpendicular direction (that is, a vertical direction in FIG. 18).

As shown in FIG. 17, N-type impurity regions 303a, 303b, 303c, and 303d are placed in the silicon substrate 300 for each pixel. The N-type impurity regions 303a are charge accumulators in the silicon substrate 300. The signal charge produced by each of the photoelectric conversion films 311 is captured by a corresponding one of pixel electrodes 309 located thereunder. Each of the pixel electrodes 309 is connected to a corresponding one of the wiring lines 305. The signal charge captured by each of the pixel electrodes 309 is temporarily stored in a corresponding one of the N-type impurity regions 303a, which are the charge accumulators, through a corresponding one of the wiring lines 305. The N-type impurity regions 303a function as floating diffusion. Each of the N-type impurity regions 303a also functions as the source of a corresponding one of the reset transistors 412a. Contact plugs 304 used to connect the wiring lines 305 to the N-type impurity regions 303a may be made of a non-metal material such as polycrystalline silicon. Each of the contact plugs 304 is connected to a corresponding one of the N-type impurity regions 303a and the gate electrode 302b of a corresponding one of the amplification transistors 412b, which are placed in a pixel region. The contact plugs 304 are connected with local wiring lines made of polycrystalline silicon.

Each of the N-type impurity regions 303b functions as the drain of a corresponding one of the reset transistors 412a and the amplification transistors 412b. Each of the N-type impurity regions 303c functions as the source of a corresponding one of the amplification transistors 412b and the drain of a corresponding one of the address transistors 412c. Each of the N-type impurity regions 303d functions as the source of a corresponding one of the address transistors 412c.

After the wiring lines 305 are formed, a protective film 306 is formed. The protective film 306 serves as a passivation film and may be composed of a silicon nitride film. Next, a contact layer (for example, a multilayer film of titanium and titanium nitride) and a layer of aluminium or the like are formed by substantially the same method as that described in the second embodiment. Thereafter, a bonding pad section (not shown) is formed.

Furthermore, a silicon oxide film 307 is formed by a plasma CVD process and is planarized by a chemical mechanical polishing (CMP) process. Holes are formed in the silicon oxide film 307 by lithography and dry etching. Copper is buried in the holes by an electroplating process, whereby copper holes 308 are formed. The copper holes 308 are planarized by the chemical mechanical polishing process.

Subsequently, the pixel electrodes 309 are formed using one or more of metals and metal nitrides such as titanium (Ti), titanium nitride (TiN), tantalum (Ta), and tantalum nitride (TaN). The pixel electrodes 309 are formed by, for example, a sputtering process that is a kind of physical vapor deposition (PVD) process. A silicon oxide thin film may be deposited on the pixel electrodes 309 for the purpose of preventing the oxidation of the pixel electrodes 309. Each of the pixel electrodes 309 is directly connected to a corresponding one of upper electrodes 312 below outside the effective pixel region without the photoelectric conversion films 311 (not shown). Each of the upper electrodes 312 in the effective pixel region functions as a counter electrode of a corresponding one of the pixel electrodes 309. The upper electrodes 312 can apply a voltage to the photoelectric conversion films 311 and can generate a signal charge due to light irradiation.

Next, the pixel electrodes 309 are isolated for each unit pixel cell 400 on the silicon substrate 300 by lithography and dry etching. That is, none of the pixel electrodes 309 is formed between the unit pixel cells 400.

Subsequently, silicon oxide films 310 are formed by a plasma CVD process. The silicon oxide films 310 are planarized to the thickness of the pixel electrodes 309 by a chemical mechanical polishing process. In this operation, it is important to expose the pixel electrodes 309 by the chemical mechanical polishing process. Each silicon oxide film 310 is located between the pixel electrodes 309.

Next, the photoelectric conversion films 311 are formed. The photoelectric conversion films 311 may be organic films or inorganic films. However, in consideration of an advantage that deposition can be performed at low temperature, an example of a case where each photoelectric conversion film 311 is composed of an organic film is described below.

The photoelectric conversion films 311, each of which is composed of the organic film, can be formed by a vapor deposition process using a metal mask. The photoelectric conversion films 311 can be formed by depositing or mixing a plurality of sections such as photoelectric conversion sections, electron transport sections, hole transport sections, electron-blocking sections, hole-blocking sections, crystallization-preventing sections, and interlayer contact-improving sections. The photoelectric conversion sections may contain an organic photoelectric conversion material. The photoelectric conversion sections may contain, for example, an organic p-type compound and/or an organic n-type compound.

The photoelectric conversion films 311 can be formed using a compound described in, for example, Japanese Patent No. 5,560,142. In, for example, paragraphs [0046] and [0047] of Japanese Patent No. 5,560,142, there is a description about materials for p-type organic semiconductors as described below. These materials are referred to as first materials.

A p-type organic semiconductor making up a photoelectric conversion layer is a donor organic semiconductor, is mainly represented by a hole-transporting organic compound, and is referred to as an organic compound with electron-donating properties. In further detail, the p-type organic semiconductor is referred to as an organic compound which is one of two organic materials that has a lower ionization potential when the two organic materials are used in contact with each other. Thus, a donor organic compound used may be any organic compound with electron-donating properties. For example, the following materials can be used: triarylamine compounds, benzidine compounds, pyrazoline compounds, styrylamine compounds, hydrazone compounds, triphenylmethane compounds, carbazole compounds, polysilane compounds, thiophene compounds, phthalocyanine compounds, cyanine compounds, merocyanine compounds, oxonol compounds, polyamine compounds, indole compounds, pyrrole compounds, pyrazole compounds; polyarylene compounds, condensed aromatic polycyclic compounds (for example, naphthalene derivatives, anthracene derivatives, phenanthrene derivatives, tetracene derivatives, pyrene derivatives, perylene derivatives, and fluoranthene derivatives), and metal complexes containing a nitrogen-containing heterocyclic compound as a ligand. Not only these, but organic compounds with an ionization potential lower than that of an organic compound used as an n-type organic semiconductor may be used as donor organic compounds.

A p-type organic semiconductor used may be any organic dye. Examples of the p-type organic semiconductor include cyanine dyes, styryl dyes, hemicyanine dyes, merocyanine dyes (including zero-methine cyanine (that is, simple merocyanine)), trinuclear merocyanine dyes, tetranuclear merocyanine dyes, rhodacyanine dyes, complex cyanine dyes, complex merocyanine dyes, allopolar dyes, oxonol dyes, hemioxonol dyes, squarylium dyes, croconium dyes, azamethine dyes, coumarin dyes, arylidene dyes, anthraquinone dyes, triphenylmethane dyes, azo dyes, azomethine dyes, spiro dyes, metallocene dyes, fluorenone dyes, fulgide dyes, perylene dyes, perinone dyes, phenazine dyes, phenothiazine dyes, quinone dyes, diphenylmethane dyes, polyene dyes, acridine dyes, acridinone dyes, diphenylamine dyes, quinacridone dyes, quinophthalone dyes, phenoxazine dyes, phthaloperylene dyes, diketopyrrolopyrrole dyes, dioxane dyes, porphyrin dyes, chlorophyll dyes, phthalocyanine dyes, metal complex dyes, and condensed aromatic polycyclic dyes (for example, naphthalene derivatives, anthracene derivatives, phenanthrene derivatives, tetracene derivatives, pyrene derivatives, perylene derivatives, and fluoranthene derivatives).

In paragraphs [0048] and [0049] of Japanese Patent No. 5,560,142, there is a description about materials for n-type organic semiconductors as described below. These materials are referred to as second materials.

An n-type organic semiconductor making up a photoelectric conversion layer may be, for example, fullerene or a fullerene derivative.

The term "fullerene" represents fullerene C60, fullerene C70, fullerene C76, fullerene C78, fullerene C80, fullerene C82, fullerene C84, fullerene C90, fullerene C96, fullerene C240, fullerene C540, mixed fullerenes, and fullerene nanotubes. The term "fullerene derivative" represents compounds produced by adding a substituent to these fullerenes.

The hole transport sections can be formed by depositing a first material. The hole transport sections have a thickness of, for example, about 0.1 µm. Thereafter, the photoelectric conversion films 311 can be formed by depositing a second material. Either vapor deposition step can be performed at a vacuum degree of, for example, $1 \times 10^{-4}$ Pa or less. The photoelectric conversion films 311 form a photoelectric conversion element that reads out a signal in such a manner that holes are moved to the pixel electrode 309 side and electrons are moved to the upper electrode 312 side facing thereto.

Next, indium tin oxide (ITO) films made of a transparent material are formed on the photoelectric conversion films 311. The ITO films can be formed in, for example, a chamber built in a vapor deposition system by a sputtering process using a metal mask without being exposed to air. The ITO films cover the photoelectric conversion films 311. The ITO films are conductive films and serve as the upper electrodes 312.

Next, a protective film 313 is formed by depositing an alumina ($Al_2O_3$) film by a sputtering process and a silicon oxynitride ($SiO_xN_y$) by a chemical vapor deposition (CVD) process. The protective film 313 serves as a passivation film for the photoelectric conversion films 311.

Next, a titanium nitride (TiN) film may be formed by a sputtering process so as to have a thickness of, for example, 250 nm. The TiN film serves as an optical black (OB) section. The OB section is treated as a standard of black in the image sensor. That is, in the signal voltage of the effective pixel region irradiated with light, the OB section is treated as dark noise (a standard of black) without light irradiation. The different in output signal between a light irradiation section of the effective pixel region and the OB section plays an important role in expressing shading. The OB section is formed outside the effective pixel region. Incidentally, the OB section is not shown in FIG. 17.

Next, a planarizing layer 314 is formed on the protective film 313 and the OB section. The planarizing layer 314 is placed for the purpose of eliminating a difference in level between the bonding pad section and the OB section. The planarizing layer 314 is made of material that can be applied by, for example, a spin coating process. The planarizing layer 314 can be formed using, for example, an organic resin material, particularly a transparent thermosetting resin material such as an acrylic resin material, a styrenic resin material, or an epoxy resin material. In this embodiment, as an example, an acrylic resin (a refractive index of 1.49 to 1.50) is used and is thermally cured at 200° C. for several minutes. This enables microlenses 315 and the structural body to be aligned in parallel to arrays of the photoelectric conversion films 311. As a result, light can be efficiently collected by the photoelectric conversion films 311 without being scattered, thereby increasing the sensitivity.

Arrays of the microlenses 315 are formed on the planarizing layer 314. The microlenses 315 can be formed using, for example, a positive photosensitive resist containing a photosensitive group derived from naphthoquinonediazide. The positive photosensitive resist has a refractive index of 1.50 to 1.70. The microlenses 315 are formed by melting resin with a heat flow such that light is efficiently collected by the photoelectric conversion films 311 and the microlenses 315 have a semi-elliptical shape. The microlenses 315 are different from the microlenses 212 described in the second embodiment. The distance between each of the microlenses 315 and a corresponding one of the photoelectric conversion films 311 (that is, light-receiving sections) is short. Therefore, in order to increase the light collection efficiency, the radius of curvature of the microlenses 315 is designed to be large, that is, the microlenses 315 are designed to be thick. The microlenses 315 may be formed in such a manner that an inorganic material such as silicon nitride or silicon oxynitride ($SiO_xN_y$) is deposited, followed by resist etch-back.

A planarizing layer 316 is formed on the microlenses 315. The purpose of the planarizing layer 316 is to eliminate differences in level caused by the microlenses 315. The planarizing layer 316 may be made of material that can be applied by, for example, a spin coating process. The planarizing layer 316 can be formed using, for example, an organic resin material, particularly a transparent thermosetting resin material such as an acrylic resin material, a styrenic resin material, or an epoxy resin material. In this embodiment, as an example, an acrylic resin (a refractive index of 1.49 to 1.50) is used and is thermally cured at 200° C. for several minutes, followed by planarization. This enables the microlenses 315 and the structural body to be aligned in parallel to the arrays of the photoelectric conversion films 311. A portion of light passing through or reflected by a light source can be guided in the structural body in the form of guided light. Guided light can propagate in a waveguide layer in the structural body without being scattered by irregularities.

A method for forming the structural body is the same as that described in the second embodiment. Forming the structural body on the planarizing layer 316 enables the imaging device to be manufactured such that the structural body and the multilayer solid-state imaging element are integral with each other.

According to this embodiment, unlike the second embodiment, light-receiving sections including a photodiode need not be placed in a silicon substrate. Therefore, the size of the unit pixel cells 400 can be reduced as compared to the second embodiment, thereby enabling high pixelation.

What is claimed is:

1. A structural body comprising:
   a first dielectric layer; and
   a second dielectric layer which is in contact with the first dielectric layer and which has a refractive index different from a refractive index of the first dielectric layer, wherein
   the second dielectric layer includes at least two dielectric films different in hydrogen concentration from each other, and
   an interface between the first dielectric layer and the second dielectric layer has periodic first irregularities.

2. The structural body according to claim 1, wherein the at least two dielectric films are different in thickness from each other.

3. The structural body according to claim 1, wherein refractive index of the second dielectric layer is higher than the refractive index of the first dielectric layer.

4. The structural body according to claim 1, wherein the at least two dielectric films are identical in refractive index to each other.

5. The structural body according to claim 1, wherein each of the at least two dielectric films is a silicon nitride film.

6. The structural body according to claim 5, wherein
   the at least two dielectric films include a first silicon nitride film and a second silicon nitride film that is thinner than the first silicon nitride film, and
   the second silicon nitride film has a higher Si—H bond concentration or a higher hydrogen concentration as compared to the first silicon nitride film.

7. The structural body according to claim 5, wherein the silicon nitride film has a refractive index of 1.90 to 2.20.

8. The structural body according to claim 1, wherein the first dielectric layer is a silicon oxide film.

9. The structural body according to claim 8, wherein the silicon oxide film has a refractive index of 1.44 to 1.47.

10. The structural body according to claim 1 further comprising:
    a third dielectric layer; and
    a fourth dielectric layer in contact with the third dielectric layer, wherein
    the second dielectric layer is positioned on the fourth dielectric layer,
    an interface between the third dielectric layer and the fourth dielectric layer has periodic second irregularities,
    the second irregularities include a second concave portion with a flat bottom and a second convex portion adjacent to the second concave portion,
    no slope is present between the flat bottom of the second concave portion and a top of the second convex portion,
    an interface between the fourth dielectric layer and the second dielectric layer has periodic third irregularities,
    the third irregularities include a third concave portion with a partly flat bottom and a third convex portion adjacent to the third concave portion, and
    a slope is present between the partly flat bottom of the third concave portion and a top of the third convex portion.

11. The structural body according to claim 1, wherein
the first irregularities include a first concave portion and a first convex portion adjacent to the first concave portion, and
a slope is present between a bottom of the first concave portion and a top of the first convex portion.

12. A structural body comprising:
a first unit structural body; and
a second unit structural body positioned on the first unit structural body, wherein
each of the first unit structural body and the second unit structural body includes a first dielectric layer and a second dielectric layer which is in contact with the first dielectric layer, second dielectric layer having a refractive index different from a refractive index of the first dielectric layer,
the second dielectric layer includes at least two dielectric films different in hydrogen concentration from each other,
an interface between the first dielectric layer and the second dielectric layer in the first unit structural body and an interface between the first dielectric layer and the second dielectric layer in the second unit structural body each have periodic first irregularities,
an interface between the first unit structural body and the second unit structural body has periodic fourth irregularities, and
the first irregularities and the fourth irregularities have the same periodicity.

13. The structural body according to claim 12, wherein the number of the at least two dielectric films included in the second dielectric layer in the first unit structural body is different from the number of the at least two dielectric films included in the second dielectric layer in the second unit structural body.

14. An imaging device comprising:
the structural body according to claim 1; and
a solid-state imaging element,
wherein the structural body is integral with the solid-state imaging element.

15. The imaging device according to claim 14, wherein the structural body includes a light-shielding film including light-shielding sections arranged in a checker pattern or a stripe pattern.

16. The imaging device according to claim 15, wherein the solid-state imaging element includes light-receiving sections and microlenses facing the light-receiving sections.

17. The imaging device according to claim 16, wherein the solid-state imaging element further includes a first planarizing layer positioned between the light-receiving sections and the microlenses.

18. The imaging device according to claim 14, further comprising a second planarizing layer positioned between the solid-state imaging element and the structural body.

19. The imaging device according to claim 14, wherein the solid-state imaging element includes
charge accumulators,
a wiring layer on the charge accumulators, and
a photoelectric conversion film on the wiring layer.

* * * * *